US011136008B2

(12) United States Patent
Lai et al.

(10) Patent No.: US 11,136,008 B2
(45) Date of Patent: Oct. 5, 2021

(54) SYSTEMS AND METHODS FOR MANAGING EXCHANGEABLE ENERGY STORAGE DEVICE STATIONS

(71) Applicant: Gogoro Inc., Hong Kong (CN)

(72) Inventors: Yun-Chun Lai, Hsinchu (TW); Sheng-Chin Chuang, New Taipei (TW); I-Fen Shih, New Taipei (TW); Chien-Chung Chen, Taoyuan (TW)

(73) Assignee: Gogoro Inc., Hong Kong (CN)

( * ) Notice: Subject to any disclaimer, the term of this patent is extended or adjusted under 35 U.S.C. 154(b) by 50 days.

(21) Appl. No.: 16/236,205

(22) Filed: Dec. 28, 2018

(65) Prior Publication Data

US 2019/0202416 A1 Jul. 4, 2019

Related U.S. Application Data

(60) Provisional application No. 62/612,249, filed on Dec. 29, 2017.

(51) Int. Cl.
*B60L 53/80* (2019.01)
*B60L 53/68* (2019.01)
(Continued)

(52) U.S. Cl.
CPC .............. *B60S 5/06* (2013.01); *B60L 53/305* (2019.02); *B60L 53/68* (2019.02); *B60L 53/80* (2019.02);
(Continued)

(58) Field of Classification Search
CPC ......... G06Q 30/0202; G06Q 10/06315; G01R 31/382; B60L 53/305; B60L 53/80; B60L 53/68; B60S 5/06; H04L 67/10
(Continued)

(56) References Cited

U.S. PATENT DOCUMENTS 5,202,617 A * 4/1993 Nor ..................... H02J 7/00036
320/130
5,462,439 A * 10/1995 Keith ..................... B60L 53/16
320/109
(Continued)

FOREIGN PATENT DOCUMENTS

CN 103814394 A 5/2014
CN 106063067 A 10/2016
(Continued)

OTHER PUBLICATIONS

Office Action received for co-pending Taiwanese Application No. TW107147512, Applicant: Gogoro Inc., dated Dec. 20, 2019, 2019, 14 pages.
(Continued)

*Primary Examiner* — John T Trischler
(74) *Attorney, Agent, or Firm* — Perkins Coie LLP

(57) ABSTRACT

Methods and associated systems for managing a battery-exchange station are provided. The method includes (1) receiving, from a server, demand information for the battery-exchange station corresponding to a first time period; and (2) forming a charging plan for a plurality of batteries positioned in the battery-exchange station corresponding to the first time period based on a first instruction set stored in the battery-exchange station and the demand information corresponding to the first time period. The first instruction set includes one or more charging rules and information indicative of assigning the one or more charging rules to each of the batteries positioned in the battery-exchange station. The charging plan comprises one or more assigned charging rules for each of the batteries positioned in the battery-exchange station.

26 Claims, 9 Drawing Sheets

(51) Int. Cl.
  *B60S 5/06* (2019.01)
  *G06Q 30/02* (2012.01)
  *G06Q 10/06* (2012.01)
  *G01R 31/382* (2019.01)
  *B60L 53/30* (2019.01)
  *G06Q 50/00* (2012.01)

(52) U.S. Cl.
  CPC ..... *G01R 31/382* (2019.01); *G06Q 10/06315* (2013.01); *G06Q 30/0202* (2013.01); *G06Q 50/00* (2013.01)

(58) Field of Classification Search
  USPC .......................................................... 320/109
  See application file for complete search history.

(56) References Cited

U.S. PATENT DOCUMENTS

| | | | | |
|---|---|---|---|---|
| 5,606,242 A * | 2/1997 | Hull | H02J 7/00047 | 320/106 |
| 5,828,863 A * | 10/1998 | Barrett | G06F 11/328 | 703/24 |
| 5,828,864 A * | 10/1998 | Danknick | G06F 11/3485 | 703/24 |
| 5,935,262 A * | 8/1999 | Barrett | G06F 11/3485 | 714/46 |
| 6,789,205 B1 * | 9/2004 | Patino | H04M 1/18 | 713/300 |
| 7,146,133 B2 * | 12/2006 | Bahl | H04W 16/14 | 455/63.1 |
| 7,227,333 B2 * | 6/2007 | Yamada | H01M 10/46 | 320/106 |
| 7,418,356 B2 * | 8/2008 | Jin | G01R 31/3648 | 702/63 |
| 7,610,057 B2 * | 10/2009 | Bahl | H04L 12/5692 | 455/522 |
| 7,728,548 B2 * | 6/2010 | Daynes | H01M 10/42 | 320/106 |
| 7,948,207 B2 * | 5/2011 | Scheucher | B60L 53/305 | 320/104 |
| 7,983,863 B2 * | 7/2011 | Jin | G01R 31/3842 | 702/63 |
| 7,996,579 B2 * | 8/2011 | Hahn | G06F 13/4081 | 702/188 |
| 8,179,087 B2 * | 5/2012 | Neumiller | A61N 1/3931 | 320/106 |
| 8,183,823 B2 * | 5/2012 | Neumiller | A61N 1/3975 | 320/106 |
| 8,200,292 B2 * | 6/2012 | Wu | H04W 52/0258 | 455/572 |
| 8,525,475 B2 * | 9/2013 | Nakamura | B60S 5/06 | 320/109 |
| 8,554,961 B2 * | 10/2013 | Hahn | G06F 13/4081 | 702/188 |
| 8,798,829 B2 * | 8/2014 | Ichikawa | B60L 53/36 | 701/22 |
| 8,798,852 B1 | 8/2014 | Chen et al. | | |
| 8,862,388 B2 * | 10/2014 | Wu | B60L 50/51 | 701/425 |
| 8,922,329 B2 * | 12/2014 | Davis | H02J 50/12 | 340/3.1 |
| 8,996,308 B2 * | 3/2015 | Wu | B60L 53/665 | 701/454 |
| 9,177,305 B2 * | 11/2015 | Penilla | B60L 53/14 | |
| 9,203,245 B2 * | 12/2015 | Aloe | G06Q 20/347 | |
| 9,229,623 B1 * | 1/2016 | Penilla | G06F 3/04883 | |
| 9,247,375 B2 * | 1/2016 | Huang | G08B 25/002 | |
| 9,285,944 B1 * | 3/2016 | Penilla | H01M 2/1077 | |
| 9,365,104 B2 * | 6/2016 | Ichikawa | H02J 50/12 | |
| 9,372,607 B1 * | 6/2016 | Penilla | G06Q 30/0226 | |
| 9,390,566 B2 * | 7/2016 | Taylor | B60L 3/0046 | |
| 9,423,937 B2 * | 8/2016 | Penilla | G06F 3/04817 | |
| 9,437,058 B2 * | 9/2016 | Luke | B60L 1/14 | |
| 9,440,544 B2 * | 9/2016 | Lewis | B60L 11/1822 | |
| 9,442,548 B1 * | 9/2016 | Johansson | G06F 1/3212 | |
| 9,467,515 B1 * | 10/2016 | Penilla | H01M 2/206 | |
| 9,536,655 B2 * | 1/2017 | Ichikawa | H02J 50/12 | |
| 9,597,973 B2 * | 3/2017 | Penilla | H01M 10/425 | |
| 9,738,168 B2 * | 8/2017 | Penilla | B60L 53/80 | |
| 9,774,588 B2 * | 9/2017 | Nethi | H04L 67/10 | |
| 9,870,670 B2 * | 1/2018 | Yau | G06Q 20/3224 | |
| 9,896,155 B2 * | 2/2018 | Tsailianis | F16H 1/28 | |
| 9,902,271 B2 * | 2/2018 | Ichikawa | B60L 53/38 | |
| 9,924,464 B2 * | 3/2018 | Cavallaro | H04W 52/0251 | |
| 9,925,882 B2 * | 3/2018 | Penilla | B60L 53/80 | |
| 9,981,566 B2 * | 5/2018 | Ichikawa | B60L 50/16 | |
| 9,985,451 B2 * | 5/2018 | Yau | H02J 7/0027 | |
| 10,040,359 B2 * | 8/2018 | Chen | H02J 7/0044 | |
| 10,086,714 B2 * | 10/2018 | Penilla | B60L 58/12 | |
| 10,155,586 B2 * | 12/2018 | Liu | B60L 53/68 | |
| 10,157,376 B2 * | 12/2018 | Aloe | G06Q 30/0641 | |
| 10,186,094 B2 * | 1/2019 | Wu | B60L 3/003 | |
| 10,223,134 B1 * | 3/2019 | Penilla | H01M 10/46 | |
| 10,245,964 B2 * | 4/2019 | Penilla | H01M 10/425 | |
| 10,286,798 B1 * | 5/2019 | Penilla | G06F 3/0488 | |
| 10,355,321 B2 * | 7/2019 | Huang | G01R 31/364 | |
| 10,460,547 B2 * | 10/2019 | Yau | G06Q 20/3224 | |
| 10,467,827 B2 * | 11/2019 | Taylor | G07C 5/0858 | |
| 10,511,050 B1 * | 12/2019 | Rahimian | H01M 10/4207 | |
| 10,529,973 B2 * | 1/2020 | Yau | H01M 2/105 | |
| 10,549,915 B1 * | 2/2020 | Theobald | B25J 15/0019 | |
| 10,556,334 B1 * | 2/2020 | Theobald | B65G 1/0492 | |
| 10,600,116 B2 * | 3/2020 | Takatsuka | G06Q 50/10 | |
| 10,613,149 B2 * | 4/2020 | Shiiyama | G01R 31/392 | |
| 10,618,411 B2 * | 4/2020 | Ichikawa | H02J 50/12 | |
| 10,643,272 B2 * | 5/2020 | Takatsuka | H02J 7/04 | |
| 10,650,444 B2 * | 5/2020 | Takatsuka | B60K 6/28 | |
| 10,684,262 B2 * | 6/2020 | Steingart | G01N 29/043 | |
| 10,688,876 B2 * | 6/2020 | Takatsuka | B60L 3/12 | |
| 2003/0209375 A1 | 11/2003 | Suzuki | H01M 10/42 | 180/65.22 |
| 2004/0259589 A1 * | 12/2004 | Bahl | H04W 16/14 | 455/553.1 |
| 2005/0007068 A1 * | 1/2005 | Johnson | H02J 7/00038 | 320/110 |
| 2005/0239497 A1 * | 10/2005 | Bahl | H04W 88/06 | 455/552.1 |
| 2007/0046263 A1 * | 3/2007 | Matsushima | H02J 7/0047 | 320/132 |
| 2007/0184339 A1 * | 8/2007 | Scheucher | B60L 50/66 | 429/99 |
| 2007/0188130 A1 * | 8/2007 | Scheucher | H01M 10/643 | 320/110 |
| 2007/0188137 A1 * | 8/2007 | Scheucher | B60L 58/27 | 320/116 |
| 2007/0266194 A1 * | 11/2007 | Hahn | G06F 13/4081 | 710/302 |
| 2008/0053716 A1 * | 3/2008 | Scheucher | H01M 2/1072 | 180/2.1 |
| 2009/0082957 A1 * | 3/2009 | Agassi | B60L 53/80 | 701/532 |
| 2009/0103341 A1 * | 4/2009 | Lee | B60L 53/24 | 363/124 |
| 2009/0295326 A1 * | 12/2009 | Daynes | A61N 1/3975 | 320/106 |
| 2010/0250043 A1 * | 9/2010 | Scheucher | H01M 2/1077 | 701/22 |
| 2011/0014501 A1 * | 1/2011 | Scheucher | H01M 10/4207 | 429/7 |
| 2011/0031929 A1 * | 2/2011 | Asada | H02J 7/0027 | 320/109 |
| 2011/0156662 A1 * | 6/2011 | Nakamura | B60S 5/06 | 320/162 |
| 2011/0296061 A1 * | 12/2011 | Hahn | G06F 13/4081 | 710/17 |
| 2012/0098481 A1 * | 4/2012 | Hunter | H02J 7/0072 | 320/106 |
| 2012/0112696 A1 * | 5/2012 | Ikeda | B60L 53/63 | 320/109 |

(56) References Cited

U.S. PATENT DOCUMENTS

| | | | | |
|---|---|---|---|---|
| 2012/0221801 A1* | 8/2012 | Okawa | ............... | G06F 12/0866 711/154 |
| 2012/0242288 A1* | 9/2012 | Birke | ............... | B60L 58/12 320/109 |
| 2012/0242293 A1* | 9/2012 | Yumura | ............... | H02J 3/32 320/134 |
| 2013/0030630 A1 | 1/2013 | Luke et al. | | |
| 2013/0030696 A1* | 1/2013 | Wu | ............... | B60L 7/14 701/431 |
| 2013/0110296 A1* | 5/2013 | Khoo | ............... | B60L 53/14 700/286 |
| 2013/0124320 A1* | 5/2013 | Karner | ............... | B60L 53/52 705/14.54 |
| 2013/0127416 A1* | 5/2013 | Karner | ............... | B60L 50/20 320/109 |
| 2013/0154577 A1* | 6/2013 | Iwane | ............... | G01R 31/367 320/162 |
| 2013/0179061 A1* | 7/2013 | Gadh | ............... | B60L 53/305 701/123 |
| 2014/0019043 A1* | 1/2014 | Wu | ............... | H01M 10/425 701/454 |
| 2014/0266006 A1 | 9/2014 | Luke et al. | | |
| 2014/0277844 A1* | 9/2014 | Luke | ............... | B60L 53/665 701/2 |
| 2014/0312831 A1* | 10/2014 | Lewis | ............... | B60L 53/65 320/107 |
| 2014/0320311 A1* | 10/2014 | Huang | ............... | H04W 4/38 340/870.09 |
| 2014/0347018 A1* | 11/2014 | Boblett | ............... | B60L 53/14 320/162 |
| 2014/0368156 A1* | 12/2014 | Aloe | ............... | G06Q 20/347 320/106 |
| 2015/0039391 A1* | 2/2015 | Hershkovitz | ...... | G06Q 30/0202 705/7.31 |
| 2015/0045947 A1* | 2/2015 | Yau | ............... | G07F 15/006 700/237 |
| 2015/0127425 A1* | 5/2015 | Greene | ............... | G06Q 10/04 705/7.31 |
| 2015/0127479 A1* | 5/2015 | Penilla | ............... | H04N 7/181 705/26.1 |
| 2015/0130419 A1* | 5/2015 | Zhai | ............... | H02J 7/007 320/112 |
| 2015/0134142 A1* | 5/2015 | Taylor | ............... | G07C 5/00 701/1 |
| 2015/0178034 A1* | 6/2015 | Penilla | ............... | G06F 9/451 345/1.1 |
| 2015/0185040 A1 | 7/2015 | Wu et al. | | |
| 2015/0306967 A1* | 10/2015 | Cohen | ............... | B60L 53/665 701/32.3 |
| 2016/0028263 A1* | 1/2016 | Yau | ............... | H02J 7/0069 320/107 |
| 2016/0047861 A1* | 2/2016 | Chen | ............... | G01R 31/367 361/78 |
| 2016/0099590 A1* | 4/2016 | Velderman | ............... | H02J 7/0045 320/113 |
| 2016/0099931 A1* | 4/2016 | Nethi | ............... | H04L 63/0815 726/8 |
| 2016/0197337 A1* | 7/2016 | Yau | ............... | H01M 10/0436 429/7 |
| 2016/0236790 A1* | 8/2016 | Knapp | ............... | G08G 5/0021 |
| 2016/0283999 A1* | 9/2016 | Toya | ............... | G06Q 30/0625 |
| 2016/0292937 A1 | 10/2016 | Taylor et al. | | |
| 2016/0303990 A1* | 10/2016 | Penilla | ............... | H01M 2/1077 |
| 2016/0343011 A1* | 11/2016 | Yamashina | ............... | G08G 1/20 |
| 2017/0039668 A1 | 2/2017 | Luke et al. | | |
| 2017/0053459 A9 | 2/2017 | Luke | | |
| 2017/0117676 A1* | 4/2017 | James | ............... | B64C 39/024 |
| 2017/0183095 A1* | 6/2017 | Liu | ............... | B60L 53/68 |
| 2017/0190259 A1* | 7/2017 | Penilla | ............... | B60L 58/12 |
| 2018/0015835 A1* | 1/2018 | Penilla | ............... | H04L 67/303 |
| 2018/0035383 A1* | 2/2018 | Cavallaro | ......... | H04W 52/0251 |
| 2018/0137715 A1* | 5/2018 | Yau | ............... | G06Q 10/30 |
| 2018/0244167 A1* | 8/2018 | Penilla | ............... | G06F 3/1454 |
| 2018/0248388 A1* | 8/2018 | Takatsuka | ............... | B60L 58/14 |
| 2018/0253787 A1* | 9/2018 | Takatsuka | ............... | G06Q 10/02 |
| 2018/0253788 A1* | 9/2018 | Takatsuka | ............... | B60L 53/65 |
| 2018/0257505 A1* | 9/2018 | Takatsuka | ............... | H02J 7/00 |
| 2018/0260887 A1* | 9/2018 | Takatsuka | ............... | B60L 58/13 |
| 2018/0367612 A1* | 12/2018 | Fallon | ............... | H04L 67/025 |
| 2019/0061541 A1* | 2/2019 | Penilla | ............... | G09G 5/14 |
| 2019/0064123 A1* | 2/2019 | Steingart | ............... | G01N 29/4427 |
| 2019/0157881 A1* | 5/2019 | Velderman | ............... | H02J 2207/40 |
| 2019/0196851 A1* | 6/2019 | Penilla | ............... | B60L 53/80 |
| 2019/0202414 A1* | 7/2019 | Shih | ............... | B60L 53/68 |
| 2019/0202415 A1* | 7/2019 | Lai | ............... | B60L 53/64 |
| 2019/0207267 A1* | 7/2019 | Vickery | ............... | H02J 7/0027 |
| 2019/0207268 A1* | 7/2019 | Lai | ............... | B60L 53/80 |
| 2019/0207393 A1* | 7/2019 | Shih | ............... | G01R 31/396 |
| 2019/0207397 A1* | 7/2019 | Lai | ............... | H01M 10/482 |
| 2019/0207398 A1* | 7/2019 | Shih | ............... | G01R 31/396 |
| 2019/0241090 A1* | 8/2019 | Wakitani | ............... | B60L 53/80 |
| 2019/0287324 A1* | 9/2019 | Wu | ............... | G01C 21/3476 |
| 2019/0299942 A1* | 10/2019 | Shih | ............... | H01M 10/482 |
| 2019/0329668 A1* | 10/2019 | Li | ............... | G01R 31/3648 |
| 2020/0066081 A1* | 2/2020 | Yau | ............... | G06Q 20/3223 |
| 2020/0083711 A1* | 3/2020 | Kanou | ............... | H02J 11/00 |
| 2020/0144586 A1* | 5/2020 | Yau | ............... | H02J 7/00036 |
| 2020/0185929 A1* | 6/2020 | Cooper | ............... | B60L 58/16 |
| 2020/0328622 A1* | 10/2020 | Abu Qahouq | ......... | B60L 53/53 |
| 2020/0376979 A1* | 12/2020 | Liang | ............... | B60L 58/16 |

FOREIGN PATENT DOCUMENTS

| | | |
|---|---|---|
| CN | 205862454 U | 1/2017 |
| EP | 0986034 A2 | 3/2000 |
| JP | 2011096233 A | 5/2011 |
| JP | 2011197932 A | 6/2011 |
| JP | 2011-197932 A | 10/2011 |
| JP | 2015015827 A | 1/2015 |
| JP | 2016-116403 A | 6/2016 |
| JP | 2016116403 A | 6/2016 |
| JP | 2017093258 A | 5/2017 |
| KR | 20120117311 A | 10/2012 |
| KR | 1020160092733 A | 8/2016 |
| KR | 1020160139996 A | 12/2016 |
| WO | 2015001930 A1 | 1/2015 |
| WO | 2017185914 A1 | 11/2017 |
| WO | 2017210170 A1 | 12/2017 |
| WO | WO-2019076245 A1 * | 4/2019 ............. G06Q 50/06 |

OTHER PUBLICATIONS

Notice of Publication received for co-pending Philippines Application No. PH1-2019-000006, Applicant: Gogoro Inc., dated Aug. 22, 2019, 3 pages.

Wikipedia, "Gogoro," Internet Article retrieved from Internet on Dec. 15, 2017, https://en.wikipedia.org/w/index.php?title=Gogoro&oldid-815535454, 4 pages.

Vincent Nguyen, "Gogoro Smartscooter is Tesla for the everyman," retrieved from Internet on Jan. 5, 2015, https://www.slashgear.com/gogoro-smartscooter-is-tesla-for-the-everyman-05362021/, 22 pages.

Jeffrey Wu, "10 advantages of Gogoro Smartscooter," retrieved from Internet on Jun. 16, 2015, http://focustaiwan.tw/news/ast/201506160026.aspx, 4 pages.

"Fact Sheet Gogoro Corporate Overview," retrieved from Internet on Jan. 5, 2015, https://images.gogoroapp.com/download/PDF/gogoro-fact-sheet-2015-01-05.pdf, 2 pages.

European Search Report for EP Application No. 18248291.9, Applicant: Gogoro Inc., dated Mar. 26, 2019, 8 pages.

Office Action received for co-pending Japanese Application No. JP 2018-245532, Applicant: Gogoro Inc., dated Mar. 3, 2020, 4 pages.

Office Action received for co-pending European Application No. EP18248291.9, Applicant: Gogoro Inc., dated Jul. 9, 2020, 9 pages.

Patrick T. Moseley et al., "Electrochemical Energy Storage for Renewable Sources and Grid Balancing," Elsevier, Nov. 7, 2014, Chapter 13, 136 pages.

(56) References Cited

OTHER PUBLICATIONS

India Office Action issued for co-pending IN Application No. IN201814049177, Applicant: Gogoro Inc., dated Jun. 23, 2021, 6 pages.

* cited by examiner

SYSTEMS AND METHODS FOR MANAGING EXCHANGEABLE ENERGY STORAGE DEVICE STATIONS

CROSS-REFERENCE TO RELATED APPLICATION

The present application claims the benefit of and priority to U.S. Provisional Application No. 62/612,249, filed Dec. 29, 2017, which is incorporated herein by reference in its entirety.

TECHNICAL FIELD

The present technology is directed to systems and methods for managing exchangeable energy storage device (e.g., exchangeable and rechargeable batteries) stations. More particularly, the present technology is directed to systems and methods for managing a battery-exchange station based on a set of instructions stored therein.

BACKGROUND

Some electric vehicles are powered by exchangeable batteries. Users of such electric vehicles usually go to battery-exchange stations to exchange batteries. Having a supply of sufficiently-charged batteries available to users when they want to make a battery exchange is an important factor in providing a satisfying user experience. However, it is very difficult to predict when and where a user may want to exchange a battery. For a battery-exchange station that handles a large number of batteries, it is even more difficult for the station to predict the battery demands and respond accordingly. Charging batteries and maintaining the state of charge of these batteries require a significant amount of energy. Unnecessary charging or maintaining can result in cost-inefficiency and energy-inefficiency. Therefore, it is advantageous to have an improved system and method to address the foregoing issues.

BRIEF DESCRIPTION OF THE DRAWINGS

Embodiments of the disclosed technology will be described and explained through the use of the accompanying drawings.

Figure 1A:
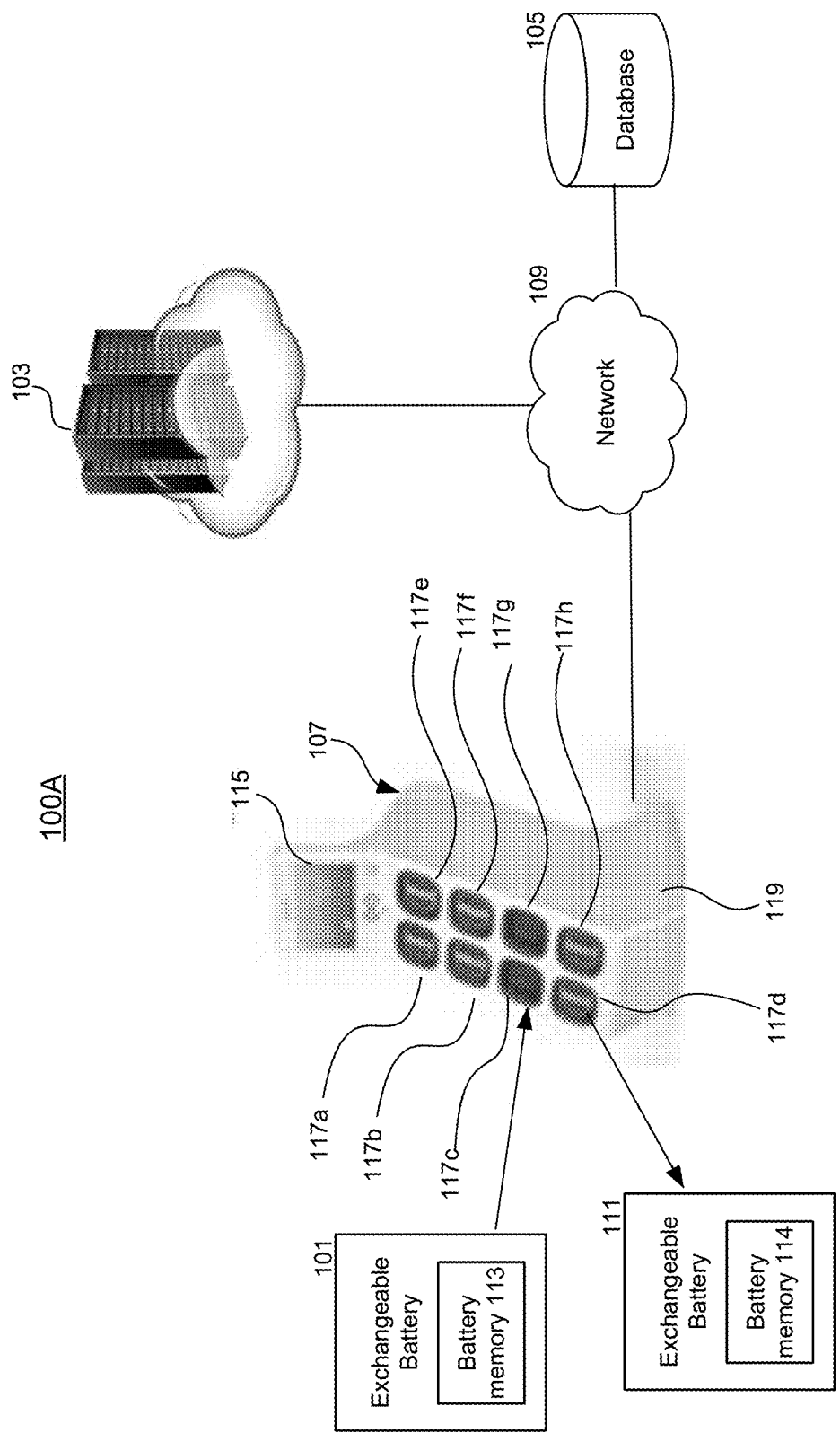
FIG. 1A is a schematic diagram illustrating a system in accordance with embodiments of the disclosed technology. The system is configured to determine a battery management plan for a battery-exchange station.

The drawings are not necessarily drawn to scale. For example, the dimensions of some of the elements in the figures may be expanded or reduced to help improve the understanding of various embodiments. Similarly, some components and/or operations may be separated into different blocks or combined into a single block for the purposes of discussion of some of the embodiments. Moreover, although specific embodiments have been shown by way of example in the drawings and described in detail below, one skilled in the art will recognize that modifications, equivalents, and alternatives will fall within the scope of the appended claims.

DETAILED DESCRIPTION

In this description, references to "some embodiments," "one embodiment," or the like, mean that the particular feature, function, structure or characteristic being described is included in at least one embodiment of the disclosed technology. Occurrences of such phrases in this specification do not necessarily all refer to the same embodiment. On the other hand, the embodiments referred to are not necessarily mutually exclusive.

The present technology is directed to a battery-exchange station that can operate autonomously based on a set of predetermined operation rules and battery demand predictions. The battery-exchange station can include an instruction set (or a battery management plan) stored therein (e.g., in a storage device/component, a memory, etc.). Based on the instruction set and demand information (e.g., a predicted demand from a server for a first time period, such us the next 12 or 24 hours), the battery-exchange station can form a charging plan for batteries positioned in the station (e.g., how to charge each of the batteries based on one or more charging rules). The instruction set includes (1) one or more charging rules; (2) information indicative of assigning the one or more charging rules to each of the batteries positioned in the battery-exchange station (e.g., "charging logics"). Both of the instruction set and the demand information can be updated by a server (e.g., by sending an updated instruction set or predicted demands for a second time period later than the first time period to the battery-exchange station). Embodiments regarding charging rules are described in applicant's applications, which are herein incorporated by reference.

When the connection between the server and the battery-exchange station is interrupted or disconnected, the present technology enables the battery-exchange station to keep operating based on the most current instruction set and demand information stored therein. For example, the most current instruction set can include a charging rule specifying charging a battery at different rates according to their states of charge (SoCs) (e.g., charging a battery with a higher SoC at a lower rate and charging a battery with a lower SoC at a higher rate). The most current demand information can be a 24-hour demand prediction received 22 hours ago. The charging plan can include "applying that SoC charging rule to all the batteries in the station" (e.g., this part is the "charging logics" mentioned above) to meet the 24-hour demand prediction. In this example, the station can continue to implement the current charging plan for two hours. If there is no update for the predicted demand from the server after two hours, the station can use a previously-received 24-hour demand prediction (e.g., or a set of default demand information) as the demand in the future, and accordingly update its charging plan. In some embodiments, the station can calculate and predict the demand information based on previously-received demand predictions (e.g., in the past week, month, or year) and the actual demand. By this arrangement, the battery-exchange station can operate autonomously based on the most current instruction set and the predicted demands.

To clarify, in some embodiments, an "overall charging plan" can refer to instructions for a server to manage multiple stations and charge the batteries therein based on one or more charging rules to meet a predicted demand (e.g., for battery exchange). A "charging plan" can refer to instructions for a battery-exchange station that are informative regarding how to charge one or more batteries therein based on one or more charging rules to meet a predicted demand. A "charging rule" can include information regarding how to charge a battery based on characteristics of battery so as to achieve an objective (e.g., increase battery life, control battery temperature, etc.). Based on the charging plan, the station can generate "charging commands" for implementing the charging rule. For example, the charging command can be a specific command (e.g., at a certain charging rate, during which time, using which power source, etc.) for a station to charge a battery.

The characteristics of battery can include, for example, one or more of (1) battery manufacturing information, (2) battery basic characteristic information, (3) battery charging information, (4) battery usage information, and (5) other suitable battery information (e.g., a unique battery identity serial number created by a battery exchange plan provider for tracking or administrative purposes). Through analyzing these sets of information and comparing the analysis results (e.g., as reference information) with the characteristics of battery, one or more charging rules can be determined.

Examples of the battery manufacturing information include battery manufacturers (e.g., batteries made by different manufacturers may have different characteristics, although their battery specifications may be the same), manufacturing dates (e.g., batteries made on different dates may have different characteristics), manufacturing batches (e.g., batteries made in different batches may still have different characteristics), hardware versions, firmware versions, cell types, and/or manufacturing serial numbers (e.g., batteries made in a batch can still have different characteristics).

Examples of the battery basic characteristic information include a battery capacity (e.g., full charge capacity, FCC), a battery discharging capacity (e.g., how much current can a battery provide under certain conditions), state-of-health (SOH), and/or a suggested battery working temperature (e.g., a temperature range such as 5 to 35 degrees Celsius).

Examples of the battery charging information include current state of charge (SOC) information, current battery temperature information, current cell temperature information, current circuit temperature information, error status information (e.g., an error or a warning message produced by a battery management system (BMS) in the battery responsive to an abnormal charge or discharge event), a suggested battery charging temperature (e.g., a temperature range such as 25 to 40 degrees Celsius), a suggested battery charging current (e.g., a constant or regulated current), a suggested battery charging voltage (e.g., a constant or regulated voltage), a suggested battery charging cycle (e.g., at least one full charging per week), a suggested battery charging speed (e.g., increasing from zero to 10% of the full capacity of a battery in 5 minutes), and/or a suggested battery charging time (e.g., not to be continuously charged for more than 5 hours).

Examples of battery usage information include battery age information (e.g., use time and/or cycle count), a battery direct current internal resistance (DCIR) information, an actual battery charging temperature (e.g., a battery was charged yesterday at 30 degrees Celsius and at 35 degrees Celsius earlier today for 25 minutes), an actual battery charging current (e.g., 1-200 Amperes), an actual battery charging voltage (e.g., 1-220 volts), an actual battery charging cycle (e.g., a battery has been through 50 full charge cycles and 125 partial cycles), an actual battery charging speed or charging rate (e.g., 20 Amperes per hour), an actual battery charging time (e.g., a battery was charged for 56 minutes yesterday), an actual battery working temperature (e.g., a battery was operating at 35 degrees Celsius yesterday for 2 hours), and an actual battery discharging time (e.g., a battery discharges at its full current capacity for 66 minutes yesterday).

The disclosed technology provides a battery-exchange station system that verifies and implements an instruction set or a battery management plan (e.g., how/when to charge one or more batteries) from a server. The battery management plan can be verified based on an aging policy (e.g., a battery management plan or an instruction set is valid for 24 hours after it was generated or issued by the server). If the battery management plan is verified, then it is implemented by the station system. If the battery management plan is not verified (e.g., expired), the station system can manage the batteries based on default rules (e.g., start to charge a battery as soon as it is positioned in the station system, stop charging a battery when the battery temperature exceeds a temperature threshold, etc.). Although the server is configured to communicate with the station system via a network in a real-time (e.g., from milliseconds to minutes) manner, sometimes the network connection can be discontinued or interrupted. When this happens, the station system of the present technology can still operate properly to provide uninterrupted services to battery users.

As background information, the server collects battery-related information (e.g., battery characteristics, charging/maintaining information, battery demands at different battery-exchange stations during certain time periods, user behavior, etc.) from various sources such as a battery memory attached to a battery, battery-exchange stations, vehicles, battery user's mobile devices, etc. Based on the collected battery information, the server generates a set of battery demand characteristics (e.g., the curves/lines shown in FIGS. 5A and 5B) for each (or each type of) battery-exchange station. The set of battery demand characteristics is used to predict a battery demand for each battery-exchange station. With such a battery demand prediction, the battery-exchange station is able to charge, prepare, and/or maintain its batteries accordingly (e.g., the goal is to meet the predict demands so as to provide satisfying battery experiences to battery users).

Although the server is capable of generating battery demands in a real-time manner, however, it may not be practical or justified because generating/calculating such demand predictions real time may consume significant amount of computing resources. Also, when one or more new users (e.g., a battery exchange plan subscriber) or one or more new battery-exchange stations are added to the battery exchange system (or are removed therefrom), the predicted battery demand can change accordingly. When the predicted battery demand changes, the corresponding battery management plan also changes. As discussed above, the disclosed system provides solutions to address the issues mentioned above by enabling individual battery-exchange stations to effectively manage (e.g., verify, implement, etc.) its battery management plan.

The disclosed battery-exchange station system includes a simulation component/module/processor configured to perform a simulation for a new or an updated battery management plan or instruction set, such that the station system can locally determine whether to implement the new or updated battery management plan. For example, 100 new users just subscribed a battery exchange plan one hour ago. The server generates an updated battery management plan based on the addresses provided by these new users (e.g., the server uses the addresses to predict where these new users will go and exchange batteries). For example, the server determines that these new users will exchange batteries at ten battery-exchange stations (e.g., in the same geographical area as identified by the addresses). Accordingly, the server sends the updated battery management plan to each of the ten battery-exchange stations. In some embodiments, the individual battery-exchange stations can have different updated management plans (e.g., one may have a significant demand increase, whereas another may have a moderate demand increase).

When an individual battery-exchange station receives its updated battery management plan, the battery-exchange station can perform a simulation for its updated battery management plan. The simulation is performed as a background process that does not substantially interfere with the implementation of an existing battery management plan. The simulation includes simulating a charging process for a battery positioned in the battery station, based on the updated battery management plan. For example, due to an expected demand increase, the updated battery management plan requests the station to charge its batteries at an increased charging rate faster than a normal rate (which is used is the existing battery management plan). After a period of time (e.g., 24 hours), the simulation result is generated (e.g., charging at the increased charging rate results in a 2-degree-Celsius temperature increase for the whole station). The simulation result is then compared to the real-world case (e.g., charging with a currently implemented plan). For example, the real-world case indicates using the normal rate to charge the batteries results in an un-met battery demand in the past 24 hours (e.g., there was a user waiting in front of the station for 10 minutes for his reserved battery before it is fully charged). In such embodiments, the disclosed system can determine to implement the updated battery management plan to provide better user battery experiences.

One aspect of the present technology is that it can be simulated and verified by multiple battery-exchange stations to check the battery demand predictions generated by a centralized server. The multiple battery-exchange stations can periodically provide feedback to the centralized server to facilitate the server to improve its battery demand predictions. Embodiments regarding battery demand predictions performed by the server are discussed in detail below with reference to FIGS. 1B, 2, 5A, and 5B. In some embodiments, a battery-exchange station can include a battery management component/module/processor configured to manage the batteries positioned therein based on information measured/collected at the station (e.g., temperature at the station, an average battery exchange time at the station, etc.). In some embodiments, the battery management component can process the measured/collected information by performing one or more machine learning processes.

Another aspect of the present technology is that it provides a battery-exchange station that can operate independently and autonomously according to a set of default operation rules. When the connection to a server is discontinued or interrupted, the disclosed battery-exchange station can still operate and provide services to battery users. In some embodiments, the disclosed system includes a set of predetermined operational instructions (or an instruction set) stored in a battery-exchange station. The operational instructions direct how the battery-exchange station is to manage, charge, or maintain the rechargeable batteries positioned therein. Examples of the operational instructions include (1) instructions for determining battery types by identifying battery manufacturers, manufacturing dates/batches, other suitable battery characteristics (e.g., the battery information discussed below), etc. (e.g., the "charging logic" mentioned above); (2) instructions for charging the batteries based on their determined types (e.g., the "charging rule" mentioned above); and (3) instructions for maintaining the batteries (e.g., not to exceed a threshold temperature). The battery-exchange station can independently (e.g., without a command from the server) operate based on the set of operational instructions.

In some embodiments, the operational instructions can be determined based on one or more algorithms regarding battery charging, pairing, selecting, or release. Various factors can be considered when implementing the algorithm, including battery characteristics (state of charge SoC, SoC delta, full charge capacity FCC, FCC delta, battery usage, discharging time/cycle counts, charging time/cycle counts, hardware/firmware versions, cell types, serious numbers, circuit temperature, cell temperature, battery counts, battery rack counts, etc.), user behavior (e.g., riding habit, riding history, etc.), user profile (subscribed battery plans, battery preference, etc.), battery demand predictions, battery pricing determination, etc. In some embodiments, the operational instructions can be determined or "trained" by a machine learning component in a battery-exchange station.

FIG. 1A is a schematic diagram illustrating a system 100A in accordance with embodiments of the disclosed technology. The system 100A is configured to determine an instruction set or a battery management plan (e.g., each has one or more charging rules) for a battery-exchange station 107. The system 100A includes a server 103, a database 105, and the battery-exchange station 107. The server 103, the database 105, and the battery-exchange station 107 can communicate with one another via a network 109. As shown, the battery-exchange station 107 includes (i) a display 115 configured to interact with a user, and (ii) a battery rack 119 having eight battery slots 117a-h configured to accommodate batteries to be charged. The server 103 is configured to generate/receive demand information (e.g., predicted demands for battery exchanges in the future based on empirical data and analyses thereof). The server 103 is also configured to generate the instruction set for the battery-exchange station 107 to form a charging plan. The server 103 is configured to send/update the instruction set and/or the demand information to the battery-exchange station 107 periodically or in response to a triggering event (e.g., a battery exchange, a change to available power for the battery-exchange station 107, a reservation for batteries, etc.). The instruction set and the demand information can be updated/sent based on different schedules.

During operation, there are only six battery slots (e.g., slots 117a, 117b, 117d, 117e, 117f, and 117h) occupied by batteries, and the remaining two slots (e.g., slots 117c and 117g) are reserved for a user to insert a battery to be exchanged (e.g., low power or depleted batteries). In some embodiments, the battery-exchange station 107 can have different arrangements such as different numbers of racks, displays, and/or slots. In some embodiments, the battery-exchange station 107 can include modular components (e.g., modular racks, modular displays, etc.) that enable an operator to conveniently install or expand the capacity of the battery-exchange station 107. The battery-exchange station 107 can be electrically coupled to one or more power sources (e.g., power grid, power lines, power storage, power station/substations, etc.) to receive power to charge the batteries positioned therein and to perform other operations (e.g., to communicate with the server 103). In some embodiments, a user can remove a battery from the battery-exchange station 107, without inserting one beforehand. In some embodiments, the battery-exchange station 107 can have a locking mechanism for securing the batteries positioned therein. In some embodiments, the battery-exchange station 107 can be implemented without the locking mechanism.

In some embodiments, the battery-exchange station 107 can receive, from the server 103, the instruction set (e.g., a first instruction set) and stored the same. The instruction set can include (1) one or more charging rules, and (2) charging logics (e.g., information indicative of how to apply the one or more charging rules to each of the batteries positioned in the battery-exchange station 107). In some embodiments, based on the charging logics, the battery-exchange station 107 can determine how to implement the charging rules so as to achieve different goals. When the connection between the server 103 and the battery-exchange station 107 is interrupted (e.g., due to an accident such as a power outage), the battery-exchange station 107 can still operate based on the received instruction set and the demand information.

For example, the charging rule can include Rules A, B, and C. Rule A can be designed to achieve the highest possible battery healthy (e.g., to mitigate battery degradation, such as a decrease of the battery's full charge capacity (FCC)). For example, if Rule A is implemented to charge a battery, the battery is expected to have a minor degradation (e.g., a 5%-10% decrease of its FCC) after 700 charging cycles. Rule B can be designed to achieve an intermediate battery-healthy goal. For example, if Rule B is implemented to charge a battery, the battery is expected to have a minor degradation (e.g., a 5%-10% decrease of its FCC) after 500 charging cycles (e.g., fewer than Rule A). Rule C can be designed to achieve a strategic goal (e.g., to fulfill battery demands) and maintain the battery health at an acceptable level. For example, if Rule C is implemented to charge a battery, the battery is expected to have a greater degradation (e.g., a 10%-15% decrease of its FCC) after 500 charging cycles.

In the embodiments discussed above, Rule A can charge the battery with a relative low current for a relatively long time, compared to Rules B and C. For example, Rule A only allows a maximum 10-Ampere charging current, whereas Plan B allows a maximum 15-Ampere charging current. For example, Rule A needs one hour to complete a charging cycle from 20% FCC to 95% FCC, whereas Rule C only needs a half hour to do so. The temperature thresholds for Rules A, B, and C can be different. For example, the temperature threshold for Rule A is 45°, the temperature threshold for Rule B is 52° C., and the temperature threshold for Rule C is 55° C.

Accordingly, the battery-exchange station 107 can form a charging plan to implement based on the received instruction set to meet the predicted demand. For example, assuming that the battery-exchange station 107 has six batteries B1-B6, the charging plan can include, "charging batteries B1 and B2 by using Rule A," "charging battery B3 by using Rule B," and "charging batteries B3-B6 by using Rule C."

In some embodiments, the battery-exchange station 107 can adjust the charging plan if the demand information cannot reflect what actually happened. For example, the demand information indicates that there should be two battery exchanges in the past hour. However, there was four battery exchanges in the past hour. In other words, the battery-exchange station 107 needs to prepare two more batteries in the future to make up the difference between the predicted demand (2 batteries were expected to be exchanged) and what actually happened (4 batteries were exchanged). In this case, the battery-exchange station 107 can adjust the charging plan by selecting a charging rule that can charge a battery faster (e.g., using a higher voltage/current to charge a battery), so as to meet the actual demands. By this arrangement, the battery-exchange station can operate autonomously by adjusting its charging plan based on actual battery demands. As discussed below with reference to FIG. 1B, a set of reference information is generated based on battery information collected from the multiple sampling batteries 101. Examples of the battery information include battery hardware/firmware version, battery cell type, battery state of charge (SOC), battery cell temperature, battery circuit temperature, battery full charge capacity (FCC), battery state of health (SOH), battery age (time or cycle counts), battery error status, battery direct current internal resistance (DCIR), etc. In some embodiments, the reference information is stored in the database 105 or the server 103. As shown in FIG. 1A, a user can insert an exchangeable battery 101 (which includes a battery memory 113 configured to store various types of battery information discussed above) into an empty battery slot (e.g., slot 117c shown in FIG. 1A) of the battery-exchange station 107. The battery-exchange station 107 can read the stored battery information and transmit the same to the server 103. The server 103 analyzes the collected battery information and identifies the characteristics of the inserted battery. Then the system compares the identified characteristics with information stored from other batteries. Based on the comparison, for example, the server 103 can select suitable temperature requirements when charging from the stored reference information. The server 103 accordingly generates a customized battery management plan for the exchangeable battery 101 to achieve an object (e.g., longest life span, high performance, etc.). Then the server 103 can generate a customized battery management plan for the whole battery-exchange station 107.

In some embodiments, the server 103 can identify one or more characteristics of the exchangeable battery 101 and generate the customized battery management plan (or instruction set) by finding a match (or a general match) from the reference information. In some embodiments, the server 103 can first identify a previous battery management plan for the battery-exchange station 107 (e.g., from the collected information) and then adjust it based on the reference information (e.g., information read from a newly received battery or from other batteries in the system or detected environment, or other information) so as to generate the customized battery management plan for the battery-exchange station 107.

In some embodiments, the reference information can be stored in the battery-exchange station 107. In such embodiments, the battery-exchange station 107 analyzes/compares the collected information and the reference information to generate the customized battery management plan. The battery-exchange station 107 can also locally store/manage a set of generated customized battery management plans for future use. In some embodiments, the battery-exchange station 107 can upload the generated customized battery management plans to the server 103 for future use.

As shown in FIG. 1A, a user can pick up a charged battery 111 (having a battery memory 114) at the station 107. The charged battery 111 has been charged by the battery-exchange station 107 based on the battery management plan customized for the charged battery 111 (e.g., this battery management plan was generated/recalled/updated when the charged battery 111 was inserted into the battery slot 117*d*). Based on a scheduled pick-up time for a battery (or a battery demand prediction) and the battery management plan, the system 100 can ensure the station 107 operates properly to meet user's demands for exchange batteries. This enhances overall user experience and improves battery performance.

Figure 1B:
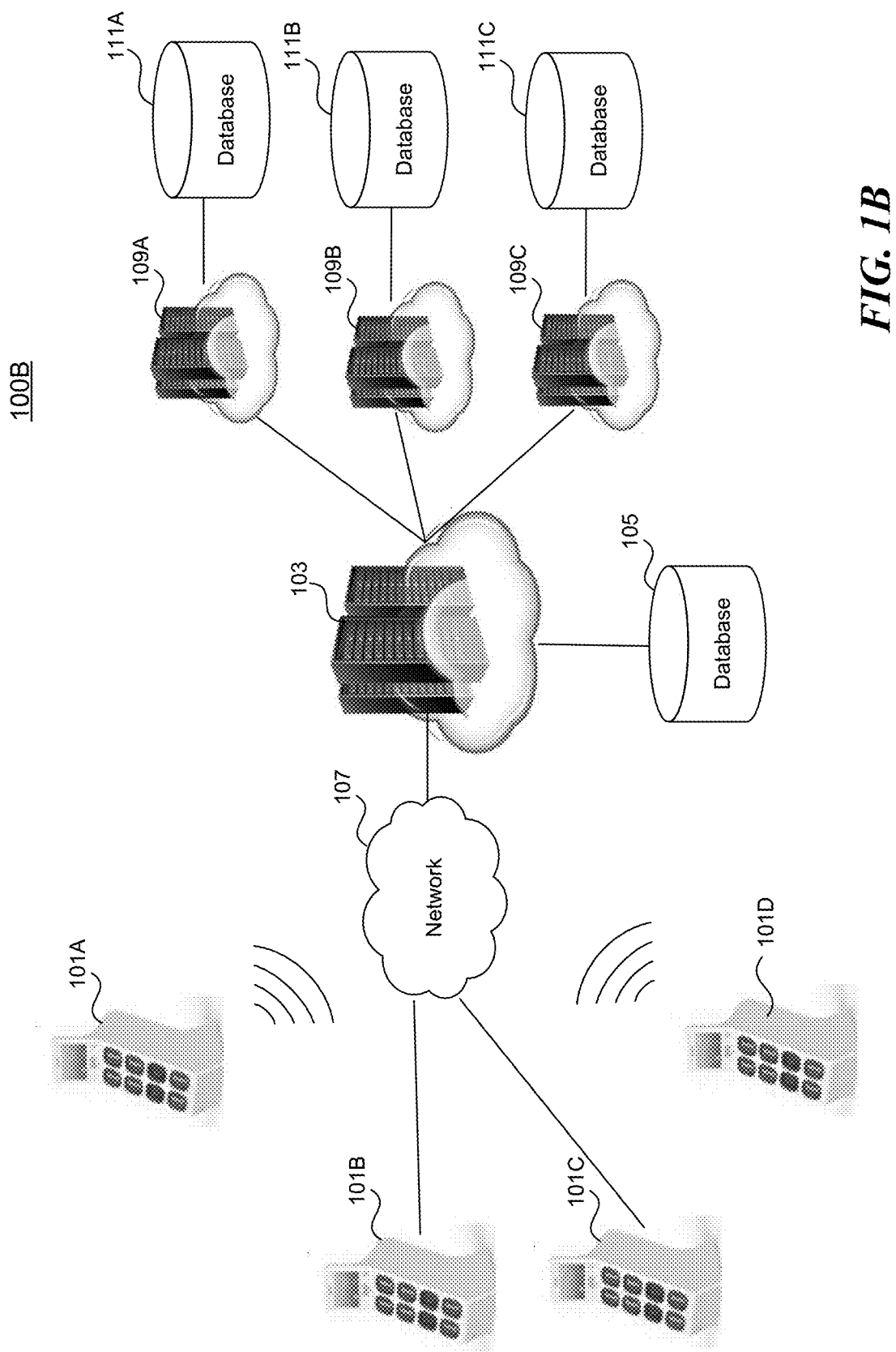
FIG. 1B is a schematic diagram illustrating a system in accordance with embodiments of the disclosed technology. The system is configured to collect battery demand information from multiple battery-exchange stations. The collected information is then used to predict future battery demands.
Figure 5A:
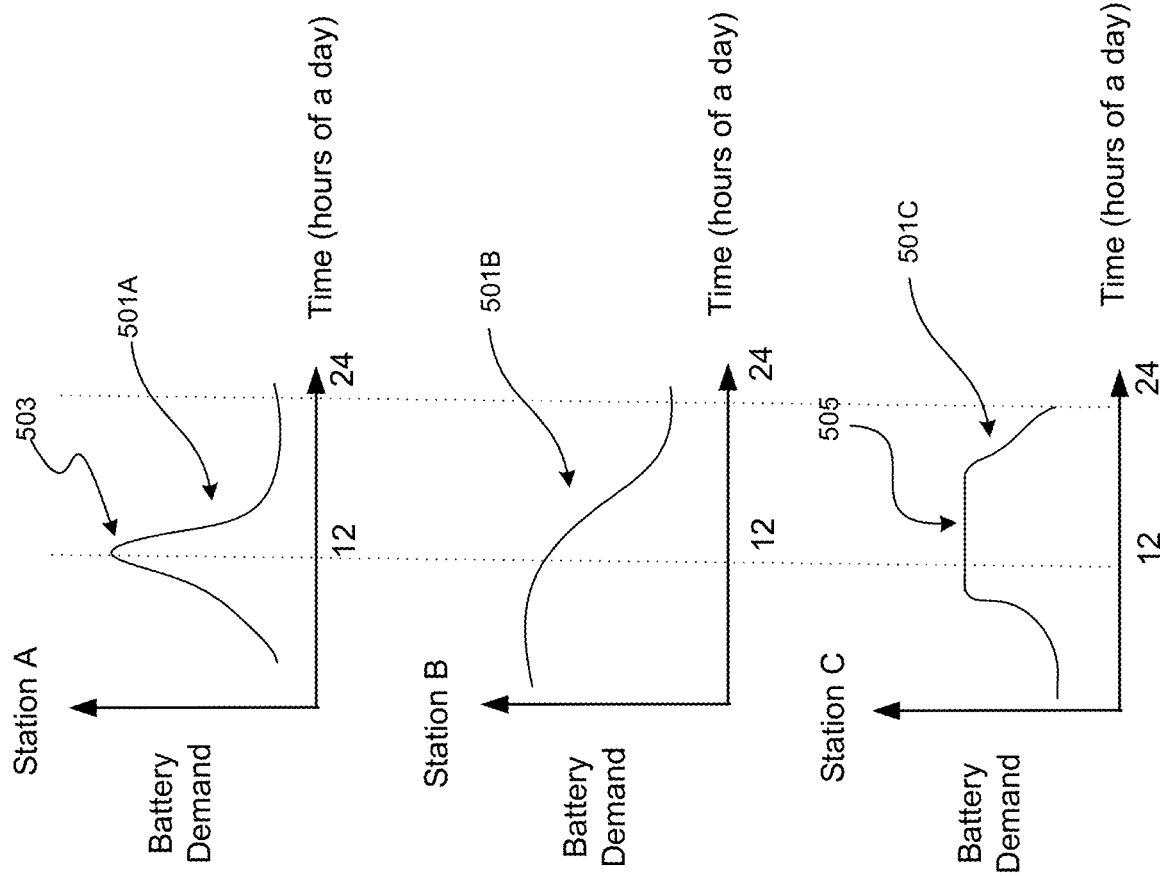
FIG. 5A is a graph illustrating station characteristics in accordance with embodiments of the disclosed technology.
Figure 5B:
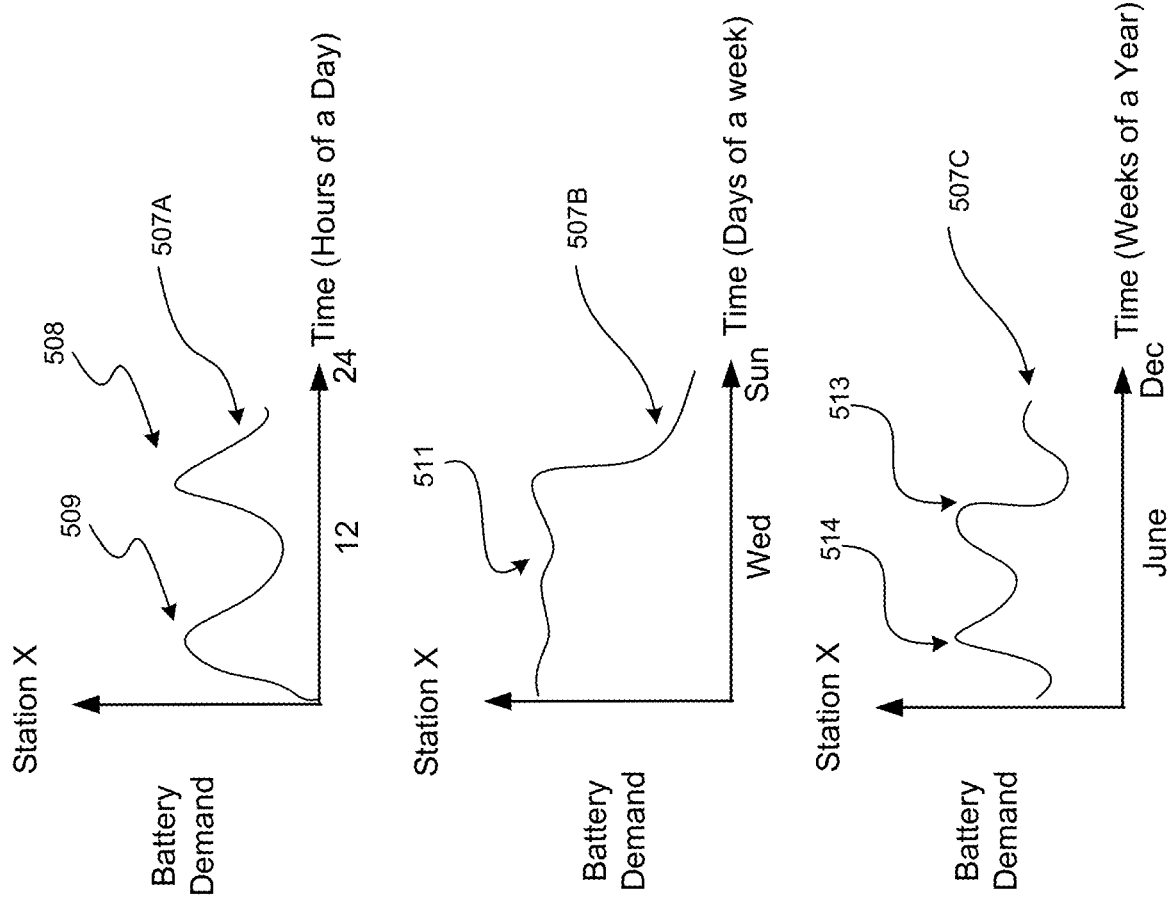
FIG. 5B is a graph illustrating station characteristics in accordance with embodiments of the disclosed technology.

FIG. 1B is a schematic diagram illustrating a system 100B in accordance with embodiments of the disclosed technology. As shown, the system 100B includes one or more battery-exchange stations 101A-D, a main server 103, a database 105, and a network 107. As shown, the battery-exchange stations 101A, 101D are wirelessly coupled to the main server 103 via the network 107. The battery-exchange stations 101B, 101C are coupled to the main server 103 via the network 107 via wired connections. The main server 103 is further coupled to the database 105, which can store reference information (e.g., battery demand reference information as shown in FIGS. 5A and 5B). The battery-exchange stations 101A-D can be electrically coupled to one or more power sources (e.g., power grid, power lines, power storage, power station/substations, etc.) to receive electric power to charge the batteries positioned therein and to perform other operations (e.g., to communicate with the main server 103).

In some embodiments, the main server 103 can be an edge server that receives client requests and coordinates fulfillment of those requests through other servers, such as servers 109A-C. The servers 109A-C are further coupled to databases 111A-C. Although each of the main server 103 and the servers 109A-C is displayed logically as a single server, these servers can each be a distributed computing environment encompassing multiple computing devices located at the same or at geographically disparate physical locations.

In some embodiments, the main server 103 and the servers 109A-C can each act as a server or client to other server/client devices. As shown, the main server 103 connects to the database 105. The servers 109A-C can each connect to one of the databases 111A-C. As discussed above, each of the main server 103 and the servers 111A-C can correspond to a group of servers, and each of these servers can share a database or can have its own database.

The databases 105, 111A-C can store information associated with the present disclosure (e.g., information collected by the main server 103, information analyzed by the main server 103, information generated by the main server 103, reference information, user account information, user battery plans, user histories, user behavior, user habits, etc.). In embodiments, at least one of the databases 111A-C can be a publicly accessible database (e.g., weather forecast database, travel alert database, traffic information database, location service database, map database, etc.) maintained by government or private entities. In some embodiments, at least one of the databases 111A-C can be a private database that provides proprietary information (e.g., user account, user credit history, user subscription information, etc.).

In the illustrated embodiments, the main server 103 is configured to collect information regarding battery demands from the battery-exchange stations 101A-D. For example, the collected information can include, (1) the locations of the battery-exchange stations 101A-D; (2) the numbers of the batteries located in the battery-exchange stations 101A-D; (3) the numbers/locations of the batteries not located in the battery-exchange stations 101A-D (e.g., the batteries are currently installed in vehicles or otherwise held or stored by users); (4) the status of charge of the above-mentioned batteries; (5) the usage histories of the batteries; (6) events close to the battery-exchange stations 101A-D; (7) environmental conditions close to the battery-exchange stations 101A-D; (8) user behavior (e.g., battery usage, user driving/riding history, user behavior, user habits, etc.) associated with the sampling stations or the batteries; and/or (9) other suitable information.

After collecting such information, the main server 103 then analyzes the collected information to identify characteristics or patterns for the battery-exchange stations 101A-D. For example, the main server 103 determines one or more battery demand characteristics/patterns based on the analysis. The determined characteristics/patterns are used as guidance for operating the battery-exchange stations 101A-D or for operating other battery-exchange stations coupled to the main server 103. The determined characteristics/patterns can also be used to generate battery pricing strategies (e.g., setting a low battery exchange price at a station to boost battery demands; setting a high battery exchange price at another station to decrease battery demands, etc.) for the battery-exchange stations 101A-D. Embodiments regarding operations of the main server 103 are discussed below with reference to FIG. 2.

The network 107 can be a local area network (LAN) or a wide area network (WAN), but it can also be other wired or wireless networks. The network 107 can be the Internet or some other public or private network. The battery-exchange stations 101A-D can be connected to the network 107 through a network interface, such as by wired or wireless communication. While the connections between the main server 103 and the servers 109A-C are shown as separate connections, these connections can be any kind of local, wide area, wired, or wireless network, including the network 107 or a separate public or private network. In some embodiments, the network 107 includes a secured network that is used by a private entity (e.g., a company, etc.).

Figure 2:
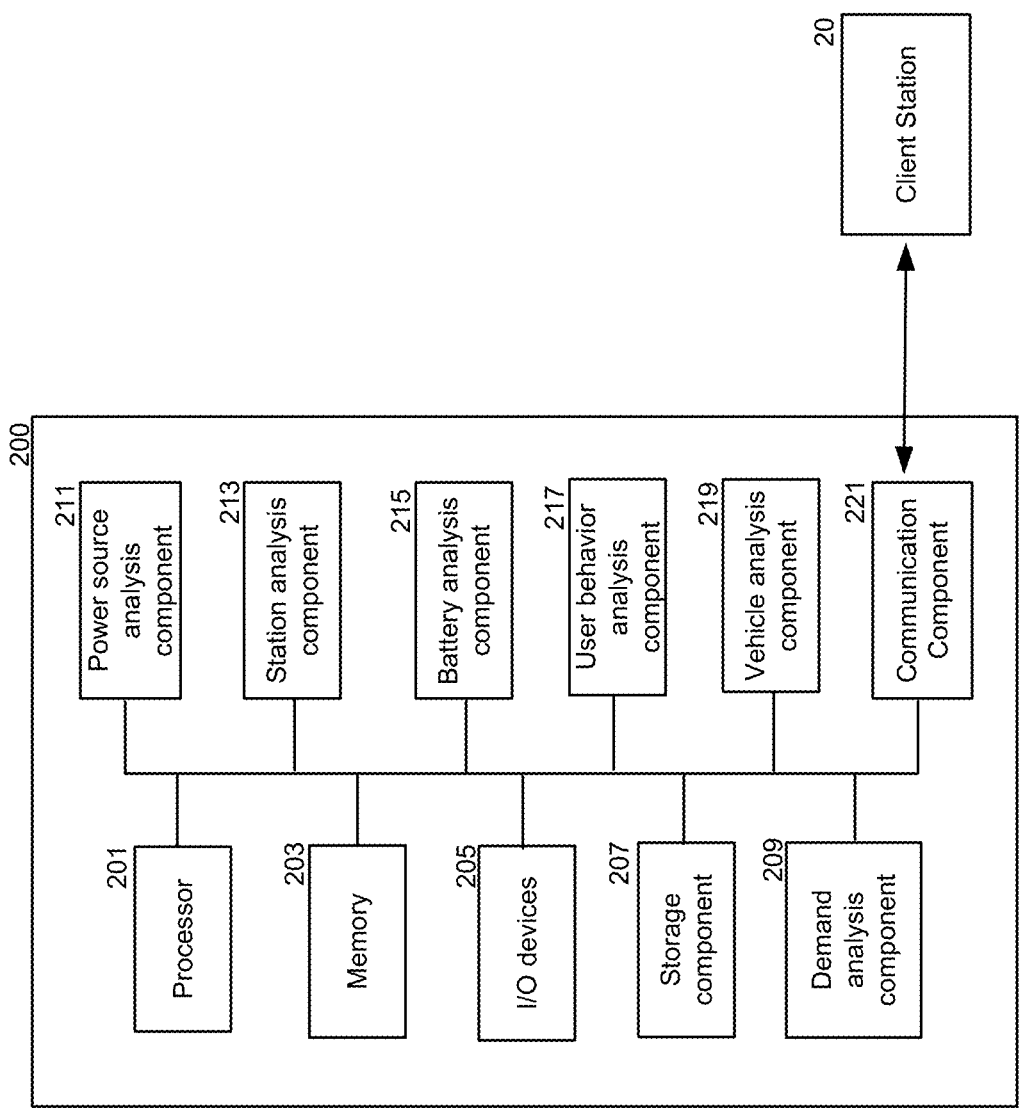
FIG. 2 is a schematic diagram illustrating a server system in accordance with embodiments of the disclosed technology.

FIG. 2 is a schematic diagram illustrating a server system 200 in accordance with embodiments of the disclosed technology. The server system 200 is configured to collect information associated with multiple batteries that can be deployed or managed by the system 200. The server system 200 is also configured to analyze the collected information and transmit, based on the analysis, a signal or a set of instructions to a client station 20 to control a process (e.g., a charging process) therein. In some embodiments, the client station 20 can be implemented as the battery-exchange stations 101A-D discussed above. In other embodiments, the client station can be implemented as other suitable client devices.

As shown in FIG. 2, the server system 200 includes a processor 201, a memory 203, input/output (I/O) devices 205, a storage component 207, a demand analysis component 209, a power source analysis component 211, a station analysis component 213, a battery analysis component 215, a user behavior analysis component 217, a vehicle analysis component 219, and a communication component 221. The processor 201 is configured to interact with the memory 203 and other components (e.g., components 205-221) in the server system 200. In some embodiments, the processor 201 can be a single processing unit or multiple processing units in a device or distributed across multiple devices. The processor 201 can be coupled to other hardware devices, for example, with the use of a bus, such as a PCI (Peripheral Component Interconnect) bus or SCSI (Small Computer System Interface) bus. The processor 201 can communicate with a hardware controller for devices, such as for the components 205-221. In one embodiment, each of the components 201, 207, 209, 211, 213, 215, 219, 221 is a set of software routines or specialized hardware (a field-programmable gate array, FPGA, etc.) to implement logic described herein.

The memory 203 is coupled to the processor 201 and is configured to store instructions for controlling other components. The memory 203 is also configured to store other information in the server system 200. In some embodiments, the memory 203 can include one or more of various hardware devices for volatile and non-volatile storage, and can include both read-only and writable memory. For example, the memory 203 can comprise random access memory (RAM), processor registers, read-only memory (ROM), writable non-volatile memory, flash memory, device buffers, and so forth. The memory 203 is not a propagating signal divorced from underlying hardware and accordingly is non-transitory. The memory 203 can further include a program memory that stores programs and software, such as an operating system. The memory 203 can also include a data memory that can store information associated with the server system 200.

The I/O devices 205 are configured to communicate with an operator (e.g., receive an input therefrom and/or present information thereto). In some embodiments, the I/O devices 205 can be one component (e.g., a touch screen display). In some embodiments, the I/O devices 205 can include an input device (e.g., keyboards, pointing devices, card reader, scanner, camera, etc.) and an output device (e.g., a display, network card, speaker, video card, audio card, printer, or other external device).

The storage component 207 is configured to store, temporarily or permanently, information/data/files/signals associated with the server system 200 (e.g., collected information, reference information, information to be analyzed, analysis results, etc.). In some embodiments, the storage component 207 can be a hard disk drive, flash memory, or other suitable storage means. The communication component 221 is configured to communicate with other systems (e.g., the client station 20 or other stations) and other devices (e.g., a mobile device carried by a user, a vehicle, etc.) via wired or wireless signals.

The demand analysis component 209 is configured to collect and store (e.g., in the storage component 207) information to be analyzed. The collected information can include (1) the locations of multiple sampling stations (e.g., in some embodiments, including the client station 20; in other embodiments, however, not including the client station 20); (2) the numbers of the batteries located in the multiple sampling stations; (3) the numbers and locations of the batteries not located in the multiple sampling stations; (4) information regarding battery manufacturers, production dates/batches, the number of charging cycles that a battery has gone through, working temperatures that a battery has experienced, charging/discharging energy amount/rates of batteries, full/current charging capacities of the batteries, and/or other suitable battery information; (5) activities or events that can potentially change users' battery experience (e.g., the way users utilize/exchange batteries); (6) environmental conditions that can potentially change users' battery experience; and/or (7) user profile information regarding user battery plans, user driving/riding histories, user behavior, user habits, etc. After receiving the collected information, the demand analysis component 209 can analyze the collected information. Each type of collected information above can be analyzed to identify characteristics/patterns representing this particular type of collected information (e.g., in a form of characteristic curves shown in FIGS. 5A and 5B, to be discussed in detail below). These identified characteristics/patterns can be considered, individually or in combination, by the demand analysis component 209 to generate a battery demand prediction for the client station 20. The battery demand prediction can be further used to generate a battery management plan for the client station 20.

In some embodiments, the demand analysis component 209 can prioritize the collected information based on its relative importance or reliability. For example, the demand analysis component 209 can use the "locations of the stations" as a primary factor and set other items as secondary factors when determining a battery demand prediction for the client station 20. In such embodiments, the system 200 can identify a daily battery demand curve (e.g., as shown in FIGS. 5A and 5B, to be discussed in detail below) for the client station 20 based on the locations of the sampling stations. The demand analysis component 209 can then consider other secondary factors to adjust a daily battery demand prediction/curve. For example, the demand analysis component 209 can increase the battery demand prediction if it determines that expected users for the client station 20 are high-demand users, based on the user profile information.

In some embodiments, the demand analysis component 209 can give different types of collected information different weightings. For example, the demand analysis component 209 can set different weightings for the factors "locations of the stations," "user behavior," "battery charging cycles" and "environmental conditions" when computing an expected demand for batteries at a particular station if one factor tends to correlate with actual measured demand. In such embodiments, the identified characteristics/patterns for each type of collected information can then be combined based on the weightings to statistically predict the expected demand. In some embodiments, the demand analysis component 209 can determine which types of collected information to be included in the prediction based on empirical studies, the results of a machine learning process, and/or system operator's preference.

In some embodiments, the demand analysis component 209 can determine the priorities or weightings for each type of the collected information based on the reliability of the collected information. For example, for information measured and collected from memories coupled to the batteries, the demand analysis component 209 can give it higher weighting or priority because the system 200 considers such information is direct/internal and thus more reliable than indirect/external information such as environmental conditions (e.g., a weather forecast, an event notice, etc.).

In some embodiments, the demand analysis component 209 can communicate and work together with other components in the system 200 (e.g., components 211-219) to generate the battery demand prediction for the client station 20.

The power source analysis component 211 is configured to analyze the status (e.g., reliability, stability, continuity, etc.) of one or more power sources that are used to power the client station 20 for charging the batteries therein. For example, the power source analysis component 211 can determine that a power source used to supply power to the client station 20 may be interrupted during 1 a.m. to 3 a.m. on a particular date, and then the power source analysis component 211 can accordingly adjust a charging instruction to the client station 20 based on the battery demand prediction. For example, the original battery demand prediction can indicate that the client station 20 needs 5 fully-charged batteries to be available at 2 a.m. on the particular date. Due to the determined possible power supply interruption, the power source analysis component 211 can instruct the client station 20 to charge the batteries needed so that they are ready by 1 a.m. on the particular date before the expected power outage.

In some embodiments, the power source analysis component 211 can also consider the cost for charging in different time periods. For example, the power source analysis component 211 determines that the charging cost from a power source is reduced during off-peak hours. The power source analysis component 211 analyze whether it is feasible for the client station 20 to charge its batteries during the off-peak hours based on the battery demand prediction from the demand analysis component 209. If so, the power source analysis component 211 can instruct the client station 20 to charge the batteries during these off-peak hours to reduce charging costs.

The station analysis component 213 is configured to categorize the multiple sampling stations into various types and identify representative characteristics/patterns for each type, such that the demand analysis component 209 can use such information as basis for its analysis. For example, the station analysis component 213 can analyze the collected information and divide the multiple sampling stations into various types based on the battery demands. For example, by analyzing the time at which batteries are exchanged, the stations can be categorized as "high-demand-all-time," "high-demand-peak-hours," "high-demand-holidays," "high-demand-weekends," "high-demand-events," and "low-demand-all-time." In some embodiments, the "high-demand-all-time" type can indicate that the station is located on a busy street. The "high-demand-peak-hours" type can infer that the station is frequently visited by commuting users during the peak hours. The "high-demand-holidays" type or the "high-demand-weekends" type can indicate that such stations are located at a tourist attraction or a site-seeing point. The "high-demand-events" type can mean that the station is located at an event-holding facility or stadium. The "low-demand-all-time" can indicate that the station is a strategic station that is built up as a relay station between two major cities. Based on the location of the station compared to other similar situated stations, the demand analysis component 209 and the station analysis component 213 can determine a suitable battery demand prediction for a client station, especially in cases where the collected information is insufficient for the demand analysis component 209 to perform a normal analysis.

Similar to the station analysis component 213, the battery analysis component 215, the user behavior analysis component 217, and the vehicle analysis component 219 are also configured to categorize the batteries, user behavior, and vehicles powered by the batteries, respectively, into various types and identify representative characteristics/patterns for each type. For example, the battery analysis component 215 can categorize the batteries based on their manufacturers, ages, original full charging capacities (FCCs), current FCCs, charging cycles, experienced working temperatures, charge/discharge profiles (e.g., steady or having peaks), battery hardware/firmware version, battery cell type, battery state of charge (SOC), battery state of health (SOH), battery direct current internal resistance (DCIR), etc. Such types or categories can facilitate the demand analysis component 209 to fine tune its battery demand prediction (and the corresponding charging instructions) for the client station 20, provided the system 200 knows what types of batteries are being exchanged at the client station 20 (e.g., such information can be provided to the server 200 by the client station 20). In some embodiments, the station analysis component 213 can be configured to generate an instruction set for the client station 20.

Similarly, the user behavior analysis component 217 can categorize the user behavior based on how they exchange and/or use the batteries. For example, a user can be very demanding on battery performance (e.g., a professional racer). As another example, another user may only use battery to power its vehicle for daily errands (e.g., picking up children or grocery shopping). Once a user reserves a battery at the client station 20, the client station 20 then provides information associated with the reservation to the server system 200. The server system 200 can then determine the type/category of the user who made the reservation and accordingly adjust the battery demand prediction (and the corresponding charging instructions) for the client station 20. In some embodiments, such an adjustment can be made by the client station 20.

The vehicle analysis component 219 can categorize the types of vehicles that users are planning to operate. For each type of vehicles, the vehicle analysis component 219 can determine which types of batteries work best for each type of vehicles. For example, the vehicle analysis component 219 can determine that an electric scooter works best with a specific type of battery after a particular charging process. In such embodiments, the vehicle analysis component 219 can work with the demand analysis component 209 to adjust the battery demand prediction (and the corresponding charging instructions), if the server system 200 receives related vehicle information. In some embodiments, such information can be found in the user profiles or account information. In other embodiments, such vehicle information can be provided by the client station 20 to the server system 200.

In some embodiments, the server system 200 can provide the battery demand prediction to the client station 20 in a real-time or near real-time manner. In such embodiments, the server system 200 monitors the status of the client station 20. Once there is a change (e.g., a user just removed two fully-charged batteries and left two empty ones at the client station 20) or a potential change (e.g., a user makes a reservation to exchange batteries at the client station 20) that may affect the charging process of the client station 20, the server system 200 can perform the analysis mentioned above and generate an updated battery demand prediction for the client station 20 to follow. In some embodiments, the change or potential change can be transmitted to the server system 200 from a mobile device (e.g., a user uses an app installed thereon to make a battery reservation), another server (e.g., a web-service server associated with an app used by a user), and/or the client station 20.

In some embodiments, the client station 20 can be a new client station (e.g., not included in the sampling stations). In such embodiments, the server system 200 can generate the battery demand prediction based on previously collected information and/or previously analysis performed by the server system 200 (e.g., as reference information). The battery demand prediction can be further used to generate a battery management plan for the client station 20. For example, the server system 200 can determine that the client station 20 can be a certain type of station (e.g., the "heavy-traffic" type, the "intermediate-traffic" type, the "light-traffic" type, the "city-commuter" type, the "tourist-attraction" type, the "event-driven" type, etc.) and then generate the battery demand prediction based on the determined type.

In some embodiments, the server system 200 manages multiple client stations simultaneously. In such embodiments, the server system 200 can monitor these client stations, collect information therefrom, and generate the battery demand prediction for each of the client stations.

Figure 3:
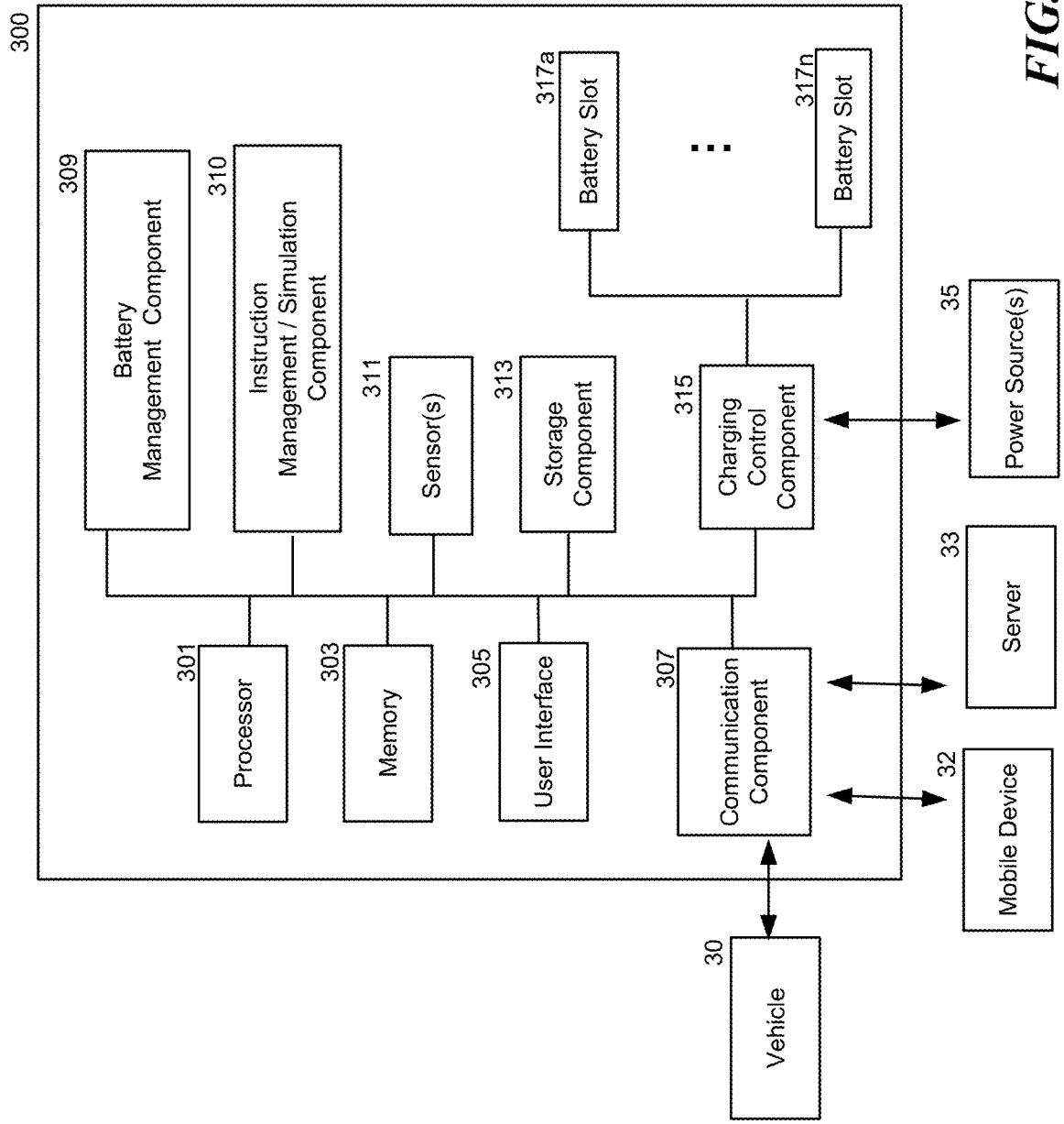
FIG. 3 is a schematic diagram illustrating a station system in accordance with embodiments of the disclosed technology.

FIG. 3 is a schematic diagram illustrating a station system 300 in accordance with embodiments of the disclosed technology. As shown, the station system 300 includes a processor 301, a memory 303, a user interface 305, a communication component 307, a battery management component 309, an instruction management/simulation component 310, one or more sensors 311, a storage component 313, and a charging component 315 coupled to eight battery slots 317a-n. The processor 301 is configured to interact with the memory 303 and other components (e.g., components 305-317) in the station system 300. The memory 303 is coupled to the processor 301 and is configured to store instructions for controlling other components or other information in the station system 300.

The user interface 305 is configured to interact with a user (e.g., receiving a user input and presenting information to the user). In some embodiments, the user interface 305 can be implemented as a touchscreen display. In other embodiments, the user interface 305 can include other suitable user interface devices. The storage component 313 is configured to store, temporarily or permanently, information, data, files, or signals associated with the station system 300 (e.g., information measured by the sensors 313, information collected by the batteries 317a-n, reference information, charging instructions; user information, etc.). The communication component 307 is configured to communicate with other systems (e.g., a vehicle system 31, a server 33, and/or other stations) and other devices (e.g., a mobile device 32 carried by a user).

The battery management component 309 is configured to manage and control the batteries positioned in the battery slots 317a-n. In some embodiments, the battery management component 309 can manage the batteries based on instructions (e.g., a battery management plan mentioned above) from the server 33 (which can function in the ways similar to the server system 200, in some embodiments). In some embodiments, the battery management component 309 can manage the batteries based on predetermined instructions or guidance (e.g., dynamic pricing strategies) stored in the station system 300 (e.g., in the storage component 313). In some embodiments, the battery management component 309 can periodically communicate with the server 33 to request update instructions.

In some embodiments, the battery management component 309 can also be configured to collect information regarding the batteries positioned in the battery slots 317a-n, information regarding the station system 300, information regarding one or more power sources 35, information regarding a user (e.g., received from the mobile device 32 via the communication component 307), and/or information regarding the vehicle system 30. The battery management component 309 can transmit or upload the collected information to the server 33 for further analysis or process.

The instruction management/simulation component 310 is configured to manage a set of operational instructions (e.g., some lightweight/fast algorithms) based on which the system 300 manages, controls, charges, and/or maintains the batteries positioned in the battery slots 317a-n. In some embodiments, the instruction management/simulation component 310 is configured to verify and implement a battery management plan (e.g., how/when to charge one or more batteries) from the server 33. In some embodiments, the battery management plan can be verified based on an aging policy (e.g., a battery management plan is valid for 12 hours after it was generated or issued by the server 33). If the battery management plan is verified, it is then implemented by the station system 300. If the battery management plan is not verified (e.g., expired), the station system 300 can manage the batteries based on default rules (e.g., a set of predetermined operational instructions stored in the system 300). In some embodiments, the default rules for each battery-exchange station can be different (e.g., depending on the location of the battery-exchange station, predicted battery demand, etc.). In some embodiments, the instruction management component 310 can be configured to manage, maintain, and update an instruction set stored in the system 300 (e.g., in the storage component 313).

In some embodiments, the instruction management/simulation component 310 is configured to perform a simulation for a new or an updated battery management plan, such that the station system can locally determine whether to implement the new or updated battery management plan. For example, another battery-exchange station was turned offline for regular maintenance. The server 33 generates an updated battery management plan for the station system 300. For example, the server 33 determines that turning that battery-exchange station offline results in an increase of the battery demand for the station system 300. Accordingly, the server 33 sends an updated battery management plan to the station system 300.

After receiving the updated battery management plan, the simulation component 310 performs a simulation for the updated battery management plan. In some embodiments, the simulation can be performed by a server. The simulation is performed as a background process that does not substantially interfere with the implementation of an existing battery management plan. In some embodiments, the simulation includes simulating a charging process for a battery positioned in the battery station, based on the updated battery management plan. In some embodiments, the simulation includes simulating whether implementing the updated battery management plan can generate a sufficient number of charged batteries to meet the actual demand. For example, due to the expected demand increase, the updated battery management plan requests the station system 300 to charge its batteries at an increased charging rate faster than a normal rate (which is used is the existing battery management plan). After a period of time (e.g., 12 hours), the simulation result is generated (e.g., charging at the increased charging rate results in a 5-degree-Celsius temperature increase for the whole station). The simulation result is then compared to the actual demand. For example, the actual demand indicates that using the normal rate to charge the batteries still meets the actual demand in the past 12 hours (e.g., there was no user waiting for reserved batteries). In such embodiments, the station system 300 can determine not to implement the updated battery management plan.

The sensors 311 are configured to measure information associated with the station system 300 (e.g., working temperature, environmental conditions, power connection, network connection, etc.). The sensors 311 can also be configured to monitor the batteries positioned in the battery slots 317a-n. The measured information can be sent to the battery management component 309 and the server 33 for further analysis.

The charging component 315 is configured to control a charging process for each of the batteries positioned in the battery slots 317a-n. In some embodiments, the station system 300 can include other numbers of battery slots. The battery slots 317a-n are configured to accommodate and charge the batteries positioned and/or locked therein. The charging component 315 receives power from the power sources 35 and then uses the power to charge the batteries positioned in the battery slots 317a-n, based on a predetermined battery management plan received from the server 33 or stored in the storage component 313. In some embodiments, the battery management plan is determined based on a battery demand prediction generated by the server 33.

In some embodiments, the battery management plan includes charging a battery to a full-charge point (e.g., 98% of its full charge capacity). In such embodiments, the charging component 315 will stop the charging process once the battery is charged to its full-charge point. In some embodiments, the system 300 can control or adjust a charging voltage during a charging process performed by the charging component 315.

In some embodiments, when the user positions a battery in one of the battery slots 317a-n, the station system 300 can detect the existence of that battery and pull information stored on the memory associated with the battery. For example, the battery management component 309 can pull information associated with that battery (e.g., battery usage history, battery identity, charging cycles, full charging capacity, vehicle information of the vehicles that the inserted battery has been associated with, user activities that the battery has been involved, etc.) from a battery memory inside, or coupled to, the inserted battery. In some embodiments, the information in the battery memory can be transmitted to the server 33 via the communication component 307.

Figure 4:
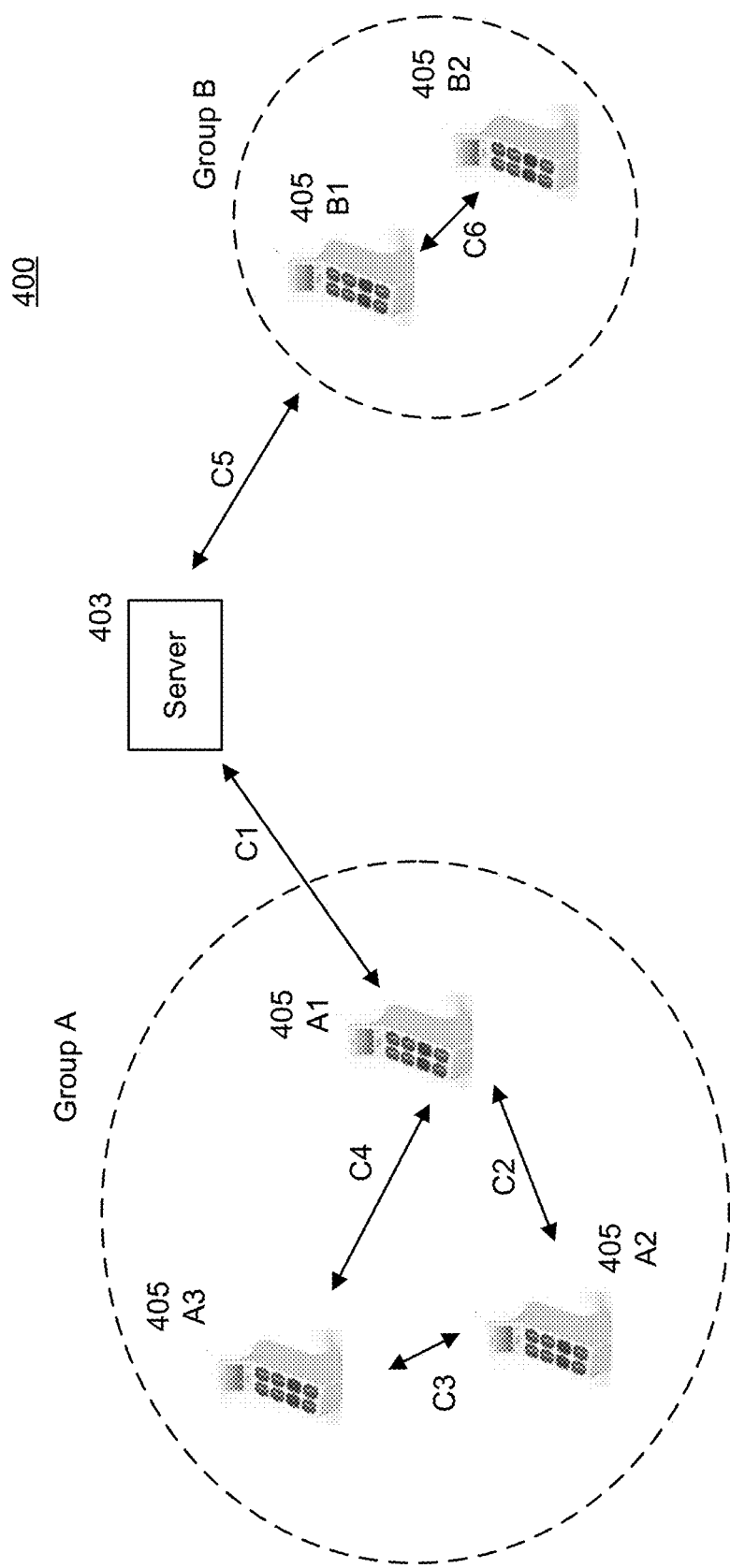
FIG. 4 is a schematic diagram illustrating a system with regional master stations in accordance with embodiments of the disclosed technology.

FIG. 4 is a schematic diagram illustrating a system 400 in accordance with embodiments of the disclosed technology. As shown in FIG. 4, the system 400 includes a server 403 (e.g., the server system 200 mentioned above) and multiple battery-exchange stations 405 (shown as stations 405A1-A3 in Group A and stations 405B1-B2 in Group B). In some embodiments, the stations 405A1-A3 are located in area A, and the stations 405B1-B2 are located in area B. In other embodiments, the stations can be grouped based on other factors such as similarity of predicted battery demands. For each group, the system 400 can designate a regional master station. In the illustrated embodiments, the station 405A1 is the regional master station in Group A, and the station 105B1 is the regional master station in Group B. The server 403 sends a battery management plan P1 to the regional master station 405A1 (e.g., indicated as arrow C1). The regional master station 405A1 verifies and simulates the battery management plan P1 (e.g., by the verification/simulation processes discussed above). The regional master station 405A1 then determines whether to adopt the battery management plan P1 for all stations in Group A. If so, the regional master station 405A1 then transmits the battery management plan P1 to stations 405A2-A3 (e.g., indicated as arrows C2-C4). Similarly, the server 403 sends a battery management plan P2 to the regional master station 405B1 (e.g., indicated as arrow C5). The regional master station 405B1 verifies and simulates the battery management plan P2 and determines whether to adopt the battery management plan P2 for all stations in Group B. If so, the regional master station 405A1 then transmits the battery management plan P2 to station 405B2 (e.g., indicated as arrow C6). The communication among the stations can be wired or wireless. By this arrangement, the system 400 can effectively manage the multiple stations 405 without requiring the server 403 to communicate with individual stations 405. This can reduce the computing/communication load for the server 403.

FIGS. 5A and 5B are schematic diagrams illustrating station characteristics in accordance with embodiments of the disclosed technology. The station characteristics are used to generate battery demand predictions (which are the basis for the battery management plan for each station). In FIG. 5A, three two-dimensional characteristic curves 501A, 501B and 501C are shown. In other embodiments, however, the characteristic curves can be three-dimensional or multiple-dimensional, depending on the number of factors to be considered when generating such characteristic curves.

The characteristic curves 501A-C represent battery demand predictions (or power consumption predictions) for Stations A-C that are generated (e.g., by a server such as the server system 200) based on information associated with multiple sampling stations (e.g., the collected information mentioned above). In some embodiments, these characteristic curves 501A-C can be compared with actual measurements so as to verify and/or enhance the accuracy of these curves (e.g., compare the characteristic curve 501A with a curve generated by actual measurement performed at Station A). In such embodiments, the results of the comparison can be used to further adjust the characteristic curves 501A-C. In some embodiments, the present technology can use this approach to fine-tune its analysis based on various factors, weightings for the factors, algorithms, etc.

As shown in FIG. 5A, the characteristic curve 501A has a peak portion 503 which can indicate that Station A is a "high-demand-peak-hours" type station. The characteristic curve 501B has a smooth curve that diminishes with time during the day and no peaks, which may indicate that Station B has a relative high battery demand in certain time period (e.g., in the mornings) and therefore can be a "commuter" type station. As for Station C, the characteristic curve 501C has a higher plateau portion 505 in the middle of a day. The plateau portion 505 can indicate that Station C has a relatively high battery demand at noon which can be caused by the traffic to a famous restaurant close to Station C. In some embodiments, the present technology can provide multiple types of characteristic curves or patterns that can be used as reference information to determine battery demand predictions for a battery-exchange station.

FIG. 5B is a schematic diagram illustrating characteristics during multiple time frames of a station system in accordance with embodiments of the disclosed technology. In FIG. 5B, three characteristic curves 507A-C for Station X are shown. The characteristic curves 507A-C represent battery demand predictions for Station X in different time frames (e.g., a day, a week, and a year) generated based on information associated with exchanges made at the station, information in the batteries, exchanges measured or predicted at the station, social events planned, etc.

As shown, the characteristic curve 507A has two peak portions 508 and 509. The peak portions 508 and 509 can indicate commuter traffic close to Station X. The characteristic curve 507B has a plateau portion 511 during the weekdays, which may indicate Station X is close to a road that is intensively used by commuters on weekdays, rather than weekends. The characteristic curve 507C also has two peak portions 513 and 514 in February and July, respectively. These two peak portions 513 and 514 can indicates battery demands caused by events held in a stadium (e.g., yearly events held in February and July) close to Station X.

Figure 6:
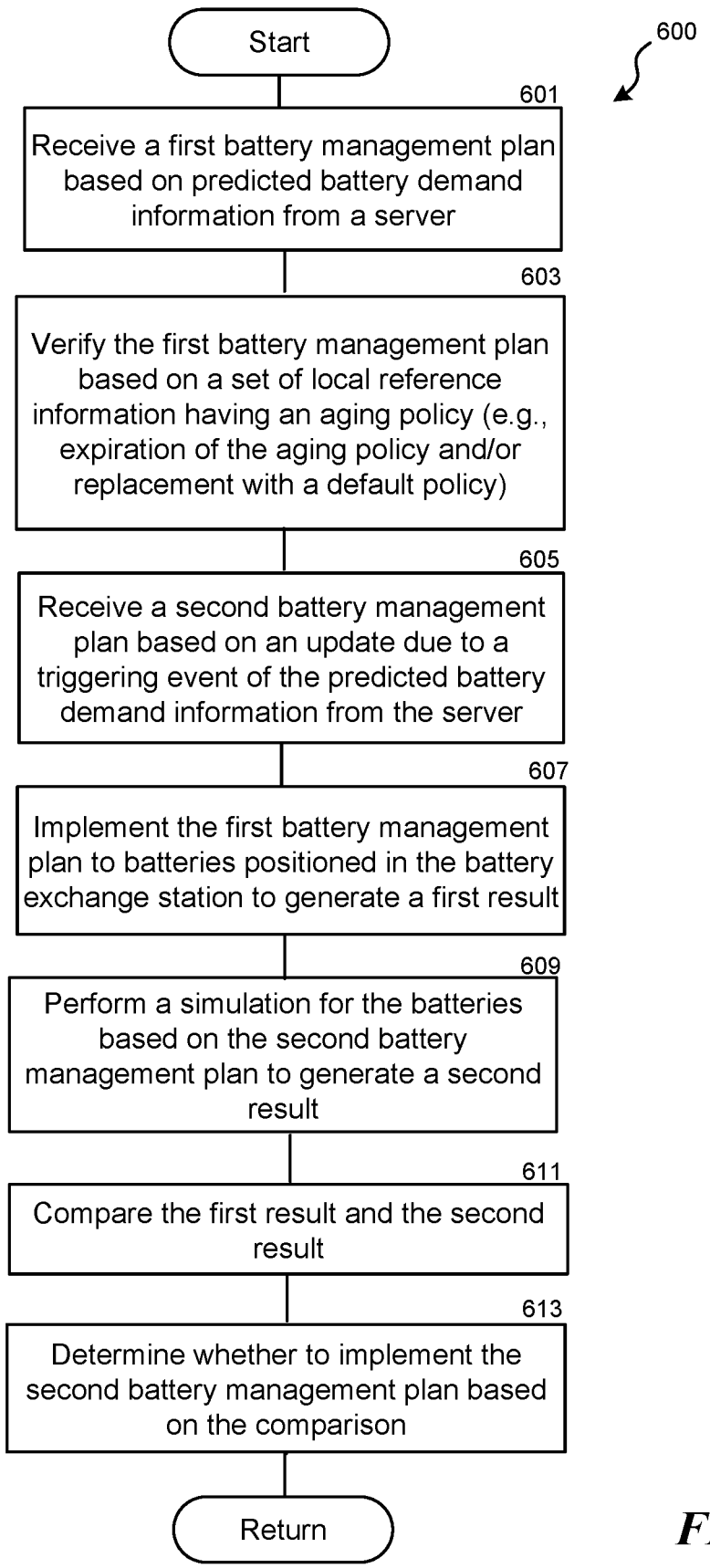
FIG. 6 is a flowchart illustrating a method in accordance with embodiments of the disclosed technology.

FIG. 6 is a flowchart illustrating a method 600 in accordance with embodiments of the disclosed technology. The method 600 is configured to managing a battery station. The method 600 can be implemented by a battery-exchange station (e.g., the station system 300). The method 600 starts at block 601 by receiving a first battery management plan based on predicted battery demand information from a server.

At block 603, the method 600 continues by verifying the first battery management plan based on a set of local reference information. The set of local reference information includes an aging policy. At block 605, the method 600 then receives a second battery management plan based on an update of the predicted battery demand information from the server. At block 607, the method 600 then implements first battery management plan for charging one or more batteries positioned in the battery-exchange station to generate a first result.

At block 609, the method 600 performs a simulation for the batteries based on the second battery management plan to generate a second result. At block 611, the first result and the second result are compared. At block 613, the method 600 determines whether to implement the second battery management plan based on the comparison. The method 600 then returns and waits for further instructions.

Figure 7:
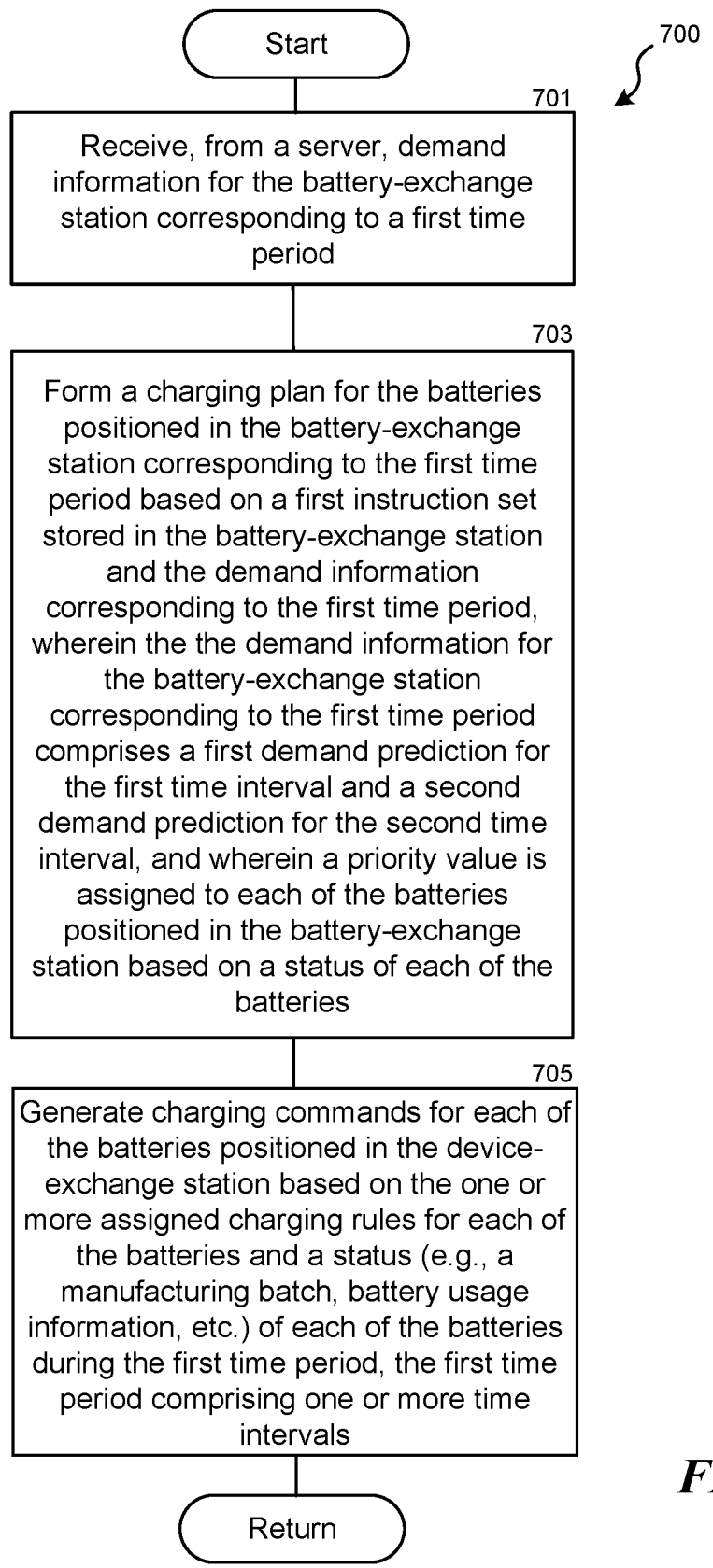
FIG. 7 is a flowchart illustrating a method in accordance with embodiments of the disclosed technology.

FIG. 7 is a flowchart illustrating a method 700 in accordance with embodiments of the disclosed technology. The method 700 can be implemented by a battery-exchange station (e.g., battery-exchange station 107 or 207, client station 20, station system 300, etc.). At block 701, the method 700 starts by receiving, from a server, demand information for the battery-exchange station corresponding to a first time period. In some embodiments, the first time period can be a 2-hour, 3-hour, 12-hour, 24-hour, one-week time period. In some embodiments, the first time period can include multiple time intervals (e.g., an hour, a half-hour, etc.). For example, the demand information corresponding to the first time period can be "2 battery exchanges in HOUR 1," "3 battery exchanges in HOUR 2," "4 battery exchanges in HOUR 3," etc. HOUR 1 refers to the next hour from now, HOUR 2 refers to the hour after the next hour, and HOUR 3 refers to the hour after HOUR 2.

At block 703, the method 700 includes forming a charging plan for the batteries positioned in the battery-exchange station corresponding to the first time period based on (1) a first instruction set stored in the battery-exchange station and (2) the demand information corresponding to the first time period. In some embodiments, the first instruction set can include (i) one or more charging rules, and (ii) information indicative of assigning the one or more charging rules to each of the batteries positioned in the battery-exchange station (e.g., "charging logics"). In some embodiments, the charging plan includes one or more assigned charging rules (e.g., selected from the one or more charging rules in the first instruction set) for each of the batteries positioned in the battery-exchange station. Once the charging plan is formed, the method 700 can charge the batteries therein based on the charging plan.

At block 705, the method 700 includes generating charging commands for each of the batteries positioned in the device-exchange station based on the one or more assigned charging rules for each of the batteries (e.g., in the charging plan) and a status (e.g., SoC, a cell temperature of battery, etc.) of each of the batteries during the first time period. For example, the predicted demand for HOUR 1 can be "2 battery exchanges," and assume that the battery-exchange station has batteries B1-B6 with SoCs of "95%," "91%," "80%," "75%," "60%," "50%," and "45%." To meet the predicted demand for HOUR 1, the station can assign a slow charge rule for batteries B1 and B2 (e.g., because batteries B1 and B2 have SoCs above a SoC threshold of 90%), and then the corresponding charging command for batteries B1 and B2 can be "charging battery B1 at a low rate 0.1 C from now until battery B1 is exchanged" and "charging battery B2 at a low rate 0.2 C from now until battery B2 is exchanged." "C" means the "C-Rate" for battery charging).

In some embodiments, the first instruction set can be updated by the server. For example, the method 700 can include (1) receiving a second instruction set from the server, the second instruction set comprising one or more updated charging rules (e.g., updated based on an analysis on characteristics of batteries, such as, charging battery B manufactured by manufacturer M below temperature T results in less battery degradation); (2) updating the one or more assigned charging rules based on the one or more updated charging rules (e.g., update the charging plan for the station); (3) updating the charging commands for each of the batteries based on the updated one or more assigned charging rules and the status of each of the batteries.

In some embodiments, the demand information can also be updated by the server. For example, the method 700 can include (1) receiving, from the server, demand information for the battery-exchange station corresponding to a second time period later than the first time period; and (2) updating the charging plan for the batteries positioned in the battery-exchange station corresponding to the second time period based on the first instruction set (of the second instruction set, if the first instruction set has been updated or replaced by the second instruction set) stored in the battery-exchange station and the demand information corresponding to the second time period. For example, the first time period can be 12 hours from now, and the second time period can be 13-24 hours from now. In other embodiments, the first and second time periods can be set by an operator of the station or the server.

In some embodiments, the charging plan can be periodically updated (e.g., daily, every 12 hours, etc.). In some embodiments, the charging plan can be updated in response to a triggering event (e.g., an event that results in a change to the predicted demand such as an exchange of battery, a new user subscription for battery exchange, and an event that results in a change to the power supply such as a power outage, an environmental condition change such as a change of ambient temperature, etc.).

In some embodiments, the triggering can be a disconnection between the server and the battery-exchange station. Once the battery-exchange station detects the disconnection (e.g., no response from the server for a certain period of time such as 30 minutes or after twice the time period that the server usually communicates with the station), the battery-exchange station can enter an "autonomous" mode and use the most current instruction set (the first or second instruction set) and the most current demand information to keep server users.

For example, the method 700 can further include (1) in response to the triggering event, considering the demand information for the battery-exchange station corresponding to the first time period as demand information for the battery-exchange station corresponding to a second time period later than the first time period; and (2) generating the charging plan for the batteries positioned in the battery-exchange station corresponding to the second time period based on the first instruction set stored in the battery-exchange station and the demand information for the battery-exchange station corresponding to the first time period. For example, the station can use the predicted demand for the first time period (0-24 hours from now) as the predicted demand for the second time period (25-48 hours from now).

In some embodiments, the battery-exchange station can assign a priority value to each of the batteries positioned in the battery-exchange station based on the status of each of the batteries. By this arrangement, the battery-exchange station can quickly determine how to apply charging rules to form the charging plan. For example, the battery-exchange station can have batteries B1-B6 with temperatures of "25° C.," "26° C.," "27° C.," "28° C.," "29° C.," "30° C." Accordingly, the priority values for batteries B1-B6 can be "6," "5," "4," "3," "2," and "1." In this example, battery B1 with the highest priority value (e.g., due to the lowest temperature) can be assigned to meet the predicted demand in HOUR 1. Battery B2 with the second highest priority value can also be assigned to meet the predicted demand in HOUR 1. Assume that the predicted demand for HOUR 2 is "1 battery exchange," and then battery B3 with the third highest priority value can be assigned to meet the predicted demand in HOUR 2.

Once the batteries are assigned to meet a predicted demand, at least one charging rule (from the charging rules in the first or second instruction set stored in the station) can be assigned to each of the assigned batteries, and the batteries are charged based on the assigned charging rule.

In some embodiments, the method 700 further includes (1) managing the first instruction set based on an aging policy; (2) verifying whether the first instruction set is expired based on the aging policy; and (3) replacing the first instruction set with a set of default rules when the first instruction set is expired. In some embodiments, the aging policy can be a set of rules used to determine whether the first instruction set is valid. For example, the aging policy can include a time period (e.g., 12 hours, 24 hours, 2 days, 1 week, etc., counting from the time that the first instruction set was generated), and after this time period, the first instruction set becomes expired. In some embodiments, when an instruction set is considered expired, the station can replace the instruction set by a default rules (or a default instruction set). For example, the default rules can include starting to charge a battery as soon as it is positioned in the station, stopping charging a battery when the battery temperature exceeds a temperature threshold, etc. In other embodiments, the default rules can include instructions used to operate the station without guidance from the server. In some embodiments, the station can update the default rules itself (e.g., based on the station's actual battery demand). In some embodiments, the station can have multiple sets of default rules, in response to various types of triggering events.

In some embodiments, the method 700 can include (1) simulating the first instruction set to generate a simulation result; (2) determining whether to update the first instruction set based on the simulation result; and (3) simulating a charging process for at least one of the batteries positioned in the battery-exchange station. In some embodiments, the simulation can be performed prior to implementing the first instruction set. In some embodiments, the simulation result can be transmitted to the server for future reference.

As will be appreciated, the server is continually receiving battery usage information from the battery-exchange stations, information from the individual batteries that are exchanged, battery reservation requests, weather information, special event information and the like in order to make a battery demand prediction for any given exchange station. The various components (e.g., software routines or dedicated logic in the server) operate in accordance the functionality described to estimate the number and type of batteries that will be needed by each exchange station in order to provide a satisfactory customer experience.

Battery management plans (or instruction sets) are based on the battery demand predictions and provide charging instructions for individual batteries in the charging slots. As indicated above, each battery-exchange station can control the rate at which an individual battery is charged, how much it is charged, the maximum charging temperature of the battery, and other factors. In the event that the expected demand for batteries at an exchange station changes, then the server generates a new battery management plan that is sent to the exchange station.

In some embodiments, the new battery management plan is immediately implemented or is sent along with a code that requires the exchange station to immediately implement the new plan. In other embodiments, the new battery management plan is simulated against the existing battery management plan to determine if the new plan is better or worse than the current battery management plan. Such a new plan may be sent with a different code indicating that the exchange station is free to implement the new battery management plan if it is better in one of more quality categories (e.g., more batteries available, lower cost of energy used to charge batteries for the expected demand, lower overall temperature in the exchange station, etc.)

In this case, the exchange station includes a processor that is programmed to calculate results for a number of various quality categories under the proposed new battery management plan and compare the results to those actually achieved or measured using the existing battery management plan. Comparing the various quality categories allows the processor of the battery-exchange station to determine whether the new battery management plan is implemented or not. The processor of the battery-exchange station then sends a message to the central server indicating whether the new battery management plan was implemented or not.

As an example, if a current battery management plan calls for having 6 fully charged batteries ready for exchange by 4 p.m. and a new battery management plan calls for an overall slower rate of charge so that the batteries will not be ready until 5:30 p.m., then the processor of the exchange station can monitor the demand for batteries to see if they are actually needed until after 5:30 p.m. If so, the new battery plan may be adopted. If there is a detected rush on batteries at 4:30 p.m., then the new plan would not have provided a better customer experience and is unlikely to be adopted.

As will be appreciated, whether a battery management plan is actually adopted, may be a multi-variant decision that is determined by which plan gives the best overall score based on two or more of the quality factors simulated and compared with measured quality data.

In some embodiments, the present technology can provide other types of characteristics or patterns by selecting different factors in different time frames. By this arrangement, the present technology enables an operator to effectively predict a battery demand for a particular battery-exchange station (e.g., this station can be a new or an existing one). The present technology provides flexibility to effectively maintain multiple battery-exchange stations. The present technology can enhance energy-efficiency and thus reduce overall expense for managing/charging batteries.

In the embodiments discussed herein, a "component" can include a processor, control logic, a digital signal processor, a computing unit, and/or any other suitable device that is either configured or is programmed to execute instructions to perform the functionality described above.

Although the present technology has been described with reference to specific exemplary embodiments, it will be recognized that the present technology is not limited to the embodiments described but can be practiced with modification and alteration within the spirit and scope of the appended claims. Accordingly, the specification and drawings are to be regarded in an illustrative sense rather than a restrictive sense.

The invention claimed is:

1. A method for managing a battery-exchange station, the method comprising:
receiving, from a server, demand information for the battery-exchange station corresponding to a first time period; and
forming a charging plan for a plurality of the batteries positioned in the battery-exchange station corresponding to the first time period based on a first instruction set stored in the battery-exchange station and the demand information corresponding to the first time period;
wherein the first instruction set comprises one or more charging rules and information indicative of assigning the one or more charging rules to each of the batteries positioned in the battery-exchange station based on a manufacturing batch of each of the batteries positioned in the battery-exchange station; and
wherein the charging plan comprises one or more assigned charging rules for each of the batteries positioned in the battery-exchange station.

2. The method of claim 1, further comprising:
receiving, from the server, demand information for the battery-exchange station corresponding to a second time period later than the first time period; and
updating the charging plan for the batteries positioned in the battery-exchange station corresponding to the second time period based on the first instruction set stored in the battery-exchange station and the demand information corresponding to the second time period.

3. The method of claim 1, further comprising:
periodically updating the charging plan for the battery-exchange station.

4. The method of claim 1, further comprising:
generating charging commands for each of the batteries positioned in the battery-exchange station based on the one or more assigned charging rules for each of the batteries and a status of each of the batteries during the first time period, the first time period comprising one or more time intervals.

5. The method of claim 4, further comprising:
receiving a second instruction set from the server, the second instruction set comprising one or more updated charging rules;
updating the one or more assigned charging rules based on the one or more updated charging rules;
updating the charging commands for each of the batteries based on the updated one or more assigned charging rules and the status of each of the batteries.

6. The method of claim 4, wherein the status of each of the batteries comprises at least one of a temperature and an SoC.

7. The method of claim 1, further comprising simulating the first instruction set to generate a simulation result.

8. The method of claim 7, further comprising determining whether to update the first instruction set based on the simulation result.

9. The method of claim 7, further comprising simulating a charging process for at least one of the batteries positioned in the battery-exchange station.

10. The method of claim 1, further comprising:
assigning the one or more charging rules to each of the batteries positioned in the battery-exchange station respectively based on battery usage information of each of the batteries positioned in the battery-exchange station.

11. The method of claim 10, wherein the battery usage information includes an actual battery charging temperature.

12. The method of claim 10, wherein the battery usage information includes an actual battery charging time.

13. The method of claim 1, further comprising:
updating the charging plan in response to a triggering event.

14. The method of claim 13, wherein the triggering event comprises a disconnection between the server and the battery-exchange station.

15. The method of claim 14, further comprising:
in response to the triggering event, considering the demand information for the battery-exchange station corresponding to the first time period as demand information for the battery-exchange station corresponding to a second time period later than the first time period; and
generating the charging plan for the batteries positioned in the battery-exchange station corresponding to the second time period based on the first instruction set stored in the battery-exchange station and the demand information for the battery-exchange station corresponding to the first time period.

16. The method of claim 1, wherein the first time period comprises a first time interval and a second time interval following the first time interval, and wherein the demand information for the battery-exchange station corresponding to the first time period comprises a first demand prediction for the first time interval and a second demand prediction for the second time interval, and wherein the method further comprises:
assigning a priority value to each of the batteries positioned in the battery-exchange station based on a status of each of the batteries.

17. The method of claim 16, further comprising:
forming the charging plan by:
assigning a first set of batteries of the batteries positioned in the battery-exchange station to meet the first demand prediction based on the priority value of each of the batteries; and
assigning a second set of batteries of the batteries positioned in the battery-exchange station to meet the second demand based on the priority value of each of the batteries.

18. The method of claim 17, further comprising:
forming the charging plan by:
assigning at least one charging rule from the one or more charging rules to each of the first set of batteries based on the first demand prediction; and
assigning at least one charging rule from the one or more charging rules to each of the second set of batteries based on the second demand prediction.

19. The method of claim 1, further comprising managing the first instruction set based on an aging policy.

20. The method of claim 19, further comprising verifying whether the first instruction set is expired based on the aging policy.

21. The method of claim 20, further comprising replacing the first instruction set with a set of default rules when the first instruction set is expired.

22. A battery-exchange station, comprising:
a processor;
a battery management component coupled to the processor and configured to—
receive, from a server, demand information for the battery-exchange station corresponding to a first time period; and
form a charging plan for the batteries positioned in the battery-exchange station corresponding to the first time period based on a first instruction set stored in the battery-exchange station and the demand information corresponding to the first time period;
wherein the first instruction set comprises one or more charging rules and information indicative of assigning the one or more charging rules to each of the batteries positioned in the battery-exchange station based on a manufacturing batch of each of the batteries positioned in the battery-exchange station; and
wherein the charging plan comprises one or more assigned charging rules for each of the batteries positioned in the battery-exchange station.

23. The battery-exchange station of claim 22, further comprising:
an instruction management component coupled to the processor and configured to manage the first instruction set based on based on an aging policy.

24. The battery-exchange station of claim 22, wherein the one or more charging rules are assigned based on battery usage information of each of the batteries positioned in the battery-exchange station.

25. The battery-exchange station of claim 24, wherein the battery usage information includes an actual battery charging temperature.

26. The battery-exchange station of claim 24, wherein the battery usage information includes an actual battery charging time.

* * * * *